United States Patent
Min et al.

(10) Patent No.: US 9,559,309 B2
(45) Date of Patent: Jan. 31, 2017

(54) COMPOUND FOR ORGANIC OPTOELECTRONIC DEVICE, ORGANIC LIGHT EMITTING DIODE INCLUDING THE SAME, AND DISPLAY DEVICE INCLUDING THE ORGANIC LIGHT EMITTING DIODE

(71) Applicants: Soo-Hyun Min, Uiwang-si (KR);
Eun-Sun Yu, Uiwang-si (KR);
Hyung-Sun Kim, Uiwang-si (KR);
Mi-Young Chae, Uiwang-si (KR)

(72) Inventors: Soo-Hyun Min, Uiwang-si (KR);
Eun-Sun Yu, Uiwang-si (KR);
Hyung-Sun Kim, Uiwang-si (KR);
Mi-Young Chae, Uiwang-si (KR)

(73) Assignee: CHEIL INDUSTRIES, INC., Gumi-Si, Kyeongsangbuk-Do (KR)

( * ) Notice: Subject to any disclaimer, the term of this patent is extended or adjusted under 35 U.S.C. 154(b) by 757 days.

(21) Appl. No.: 13/908,205

(22) Filed: Jun. 3, 2013

(65) Prior Publication Data
US 2013/0256645 A1    Oct. 3, 2013

Related U.S. Application Data

(63) Continuation of application No. PCT/KR2011/008402, filed on Nov. 7, 2011.

(30) Foreign Application Priority Data

Dec. 2, 2010 (KR) .................... 10-2010-0122206

(51) Int. Cl.
| | | |
|---|---|---|
| H01L 51/54 | (2006.01) | |
| C09K 11/06 | (2006.01) | |
| H01L 51/00 | (2006.01) | |
| H05B 33/14 | (2006.01) | |
| C09B 57/00 | (2006.01) | |
| H01L 51/50 | (2006.01) | |

(52) U.S. Cl.
CPC ........... *H01L 51/0052* (2013.01); *C09B 57/00* (2013.01); *C09B 57/008* (2013.01); *C09K 11/06* (2013.01); *H01L 51/006* (2013.01); *H01L 51/0054* (2013.01); *H01L 51/0061* (2013.01); *H01L 51/0067* (2013.01); *H01L 51/0072* (2013.01); *H01L 51/0074* (2013.01); *H05B 33/14* (2013.01); *C09K 2211/1014* (2013.01); *C09K 2211/1029* (2013.01); *C09K 2211/1044* (2013.01); *C09K 2211/1059* (2013.01); *C09K 2211/1092* (2013.01); *H01L 51/5012* (2013.01); *H01L 51/5072* (2013.01); *Y02E 10/549* (2013.01)

(58) Field of Classification Search
CPC ...... Y02E 10/549; C09B 57/00; C09B 57/008; C09K 11/06; C09K 2211/10; C09K 2211/1003; C09K 2211/1011; C09K 2211/1014; C09K 2211/1018; C09K 2211/1029; C09K 2211/1044; C09K 2211/1059; C09K 2211/1092; H01L 51/0032; H01L 51/005; H01L 51/0052; H01L 51/0054; H01L 51/0056; H01L 51/0059; H01L 51/006; H01L 51/0061; H01L 51/0062; H01L 51/0067; H01L 51/0068; H01L 51/0071; H01L 51/0072; H01L 51/0074; H01L 51/50; H01L 51/5012; H01L 51/5072; H01L 51/5052; H01L 51/5048; H01L 51/5056; H01L 51/506; H05B 33/14

USPC ....... 428/690, 691, 411.4, 336, 917; 427/58, 427/66; 313/500–512; 257/40, 88–104, 257/E51.001–E51.052; 252/301.16–301.35; 544/180, 242, 333; 564/427; 546/285, 102, 281.1; 548/445, 548/418; 549/43

See application file for complete search history.

(56) References Cited

U.S. PATENT DOCUMENTS

| | | |
|---|---|---|
| 2006/0073357 A1 | 4/2006 | Brunner et al. |
| 2007/0224446 A1 | 9/2007 | Nakano et al. |
| 2008/0145699 A1 | 6/2008 | Yabe et al. |
| 2008/0220285 A1* | 9/2008 | Vestweber .............. C07C 13/62 428/690 |
| 2009/0167162 A1 | 7/2009 | Lin et al. |
| 2009/0224658 A1 | 9/2009 | Iwakuma et al. |

(Continued)

FOREIGN PATENT DOCUMENTS

| | | | | |
|---|---|---|---|---|
| DE | WO 2010015306 A1 * | 2/2010 | ......... | H01L 51/0058 |
| DE | WO 2011060877 A2 * | 5/2011 | ........... | C07D 403/10 |

(Continued)

OTHER PUBLICATIONS

Machine translation of JP2011-082238. Date of publication: Apr. 21, 2011.*

(Continued)

*Primary Examiner* — Andrew K Bohaty
(74) *Attorney, Agent, or Firm* — Lee & Morse, P.C.

(57) ABSTRACT

A compound for an organic optoelectronic device, an organic light emitting diode including the same, and a display device including the organic light emitting diode are disclosed, the compound being represented by the following Chemical Formula 1:

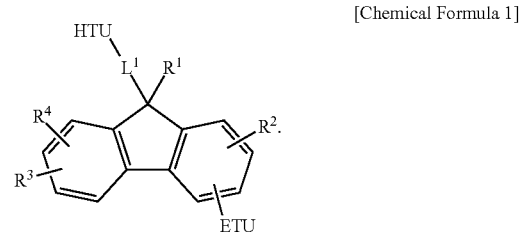

[Chemical Formula 1]

17 Claims, 3 Drawing Sheets

(56) References Cited

U.S. PATENT DOCUMENTS

| | | |
|---|---|---|
| 2009/0302745 A1 | 12/2009 | Otsu et al. |
| 2010/0213826 A1 | 8/2010 | Kim et al. |
| 2011/0037027 A1 | 2/2011 | Stoessel et al. |
| 2011/0121274 A1* | 5/2011 | Parham ............... H01L 51/0058 257/40 |
| 2012/0211736 A1 | 8/2012 | Kim et al. |
| 2012/0228552 A1* | 9/2012 | Parham ................ C07D 403/10 252/301.16 |
| 2013/0001538 A1 | 1/2013 | Kwong et al. |

FOREIGN PATENT DOCUMENTS

| | | |
|---|---|---|
| JP | 2004-300044 A | 10/2004 |
| JP | 2005-112765 A | 4/2005 |
| JP | 2007-067383 A | 3/2007 |
| JP | 2007-288035 A | 11/2007 |
| JP | 2009-263579 A | 11/2009 |
| JP | 2009-267257 A | 11/2009 |
| JP | 2010-183072 A | 8/2010 |
| JP | 2011082238 A * | 4/2011 |
| KR | 10 2005-0100673 A | 10/2005 |
| KR | 10 2008-0013934 A | 2/2008 |
| KR | 10 2008-0080306 A | 9/2008 |
| KR | 10 2008-0104025 A | 11/2008 |
| KR | 10 2009-0016684 A | 2/2009 |
| KR | 10 2011-0043342 A | 4/2011 |
| KR | 10 2011-0048840 A | 5/2011 |
| WO | WO 2006/067976 A1 | 6/2006 |
| WO | WO 2009/021126 A2 | 2/2009 |
| WO | WO 2009/057978 A2 | 5/2009 |
| WO | WO 2009/124627 A1 | 10/2009 |
| WO | WO 2011-000455 A1 | 1/2011 |

OTHER PUBLICATIONS

Tao et al. Chem. Mater. 2010, 22, 2138-2141. Date of online publication: Jan. 29, 2010.*

Jiao et al. Adv. Funct. Mater. 2008, 18, 2335-2347. Date of publication: Jul. 18, 2008.*

International Search Report in PCT/KR2011/008402, dated Jun. 11, 2013 (Min, et al.).

* cited by examiner

COMPOUND FOR ORGANIC OPTOELECTRONIC DEVICE, ORGANIC LIGHT EMITTING DIODE INCLUDING THE SAME, AND DISPLAY DEVICE INCLUDING THE ORGANIC LIGHT EMITTING DIODE

CROSS-REFERENCE TO RELATED APPLICATIONS

This application is a continuation of pending International Application No. PCT/KR2011/008402, entitled "COMPOUND FOR ORGANIC OPTOELECTRONIC DEVICE, ORGANIC LIGHT EMITTING DIODE INCLUDING THE SAME, AND DISPLAY DEVICE INCLUDING THE ORGANIC LIGHT EMITTING DIODE," which was filed on Nov. 7, 2011, the entire contents of which are hereby incorporated by reference.

Korean Patent Application No. 10-2010-0122206 filed on Dec. 2, 2010, in the Korean Intellectual Property Office, and entitled: "COMPOUND FOR ORGANIC OPTOELECTRONIC DEVICE, ORGANIC LIGHT EMITTING DIODE INCLUDING THE SAME, AND DISPLAY DEVICE INCLUDING THE ORGANIC LIGHT EMITTING DIODE," is incorporated by reference herein in its entirety.

BACKGROUND

1. Field

Embodiments relate to a compound for an organic optoelectronic device, an organic light emitting diode, and a display device including the organic light emitting diode.

2. Description of the Related Art

An organic photoelectric device is a device requiring a charge exchange between an electrode and an organic material by using holes or electrons.

An organic optoelectronic device may be classified in accordance with its driving principles. One type of organic optoelectronic device is an electronic device driven as follows: excitons are generated in an organic material layer by photons from an external light source; the excitons are separated into electrons and holes; and the electrons and holes are transferred to different electrodes as a current source (voltage source).

Another type of organic optoelectronic device is an electronic device driven as follows: a voltage or a current is applied to at least two electrodes to inject holes and/or electrons into an organic material semiconductor positioned at an interface of the electrodes, and the device is driven by the injected electrons and holes.

Examples of the organic optoelectronic device may include an organic photoelectronic device, an organic light emitting diode, an organic solar cell, an organic photoconductor drum, an organic transistor, and the like, which may include a hole injecting or transport material, an electron injecting or transport material, or a light emitting material.

SUMMARY

Embodiments are directed to an organic optoelectronic device, an organic light emitting diode, and a display device including the organic light emitting diode.

The embodiments may be realized by providing a compound for an organic optoelectronic device, the compound being represented by the following Chemical Formula 1:

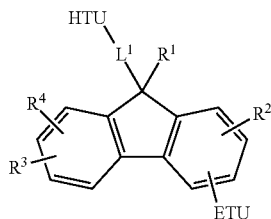

[Chemical Formula 1]

wherein, in the above Chemical Formula 1, HTU is a substituent having hole characteristics, ETU is a substituent having electron characteristics, $L^1$ is a single bond, a substituted or unsubstituted C2 to C6 alkenylene group, a substituted or unsubstituted C2 to C6 alkynylene group, a substituted or unsubstituted C6 to C30 arylene group, a substituted or unsubstituted C2 to C30 heteroarylene group, or a combination thereof, $R^1$ to $R^4$ are each independently hydrogen, a substituted or unsubstituted C1 to C6 alkyl group, a substituted or unsubstituted C6 to C30 aryl group, a substituted or unsubstituted C2 to C30 heteroaryl group, or a combination thereof, and $R^1$, $L^1$, and HTU are independently present or are fused to provide a spiro structure having hole characteristics.

The embodiments may also be realized by providing an organic light emitting diode including an anode; a cathode; and at least one organic thin layer between the anode and the cathode, wherein the at least one organic thin layer includes the compound for an organic optoelectronic device according to an embodiment.

The embodiments may also be realized by providing a display device including the organic light emitting diode according to an embodiment.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
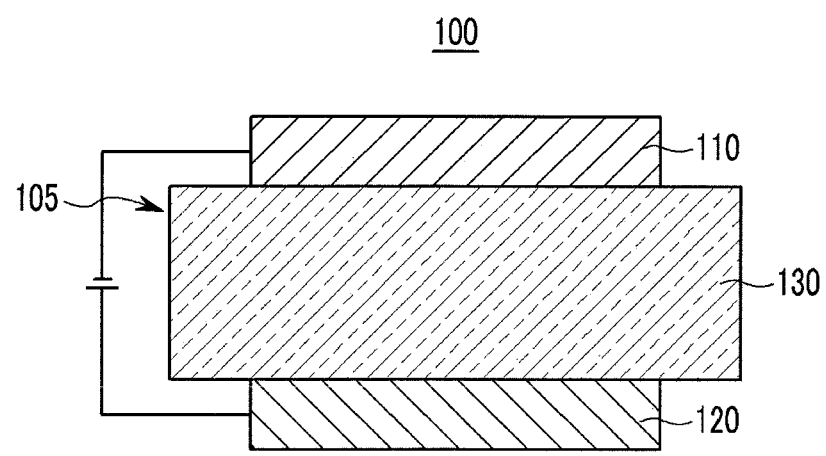
FIGS. 1 to 5 illustrate cross-sectional views showing organic light emitting diodes according to various embodiments.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. Like reference numerals refer to like elements throughout.

In the present specification, when a definition is not otherwise provided, "substituted" may refer to one substituted with a C1 to C30 alkyl group; a C1 to C10 alkylsilyl group; a C3 to C30 cycloalkyl group; a C6 to C30 aryl group; a C2 to C30 heteroaryl group; a C1 to C10 alkoxy group; a fluoro group, a C1 to C10 trifluoroalkyl group such as a trifluoromethyl group, and the like; or a cyano group.

In the present specification, when a definition is not otherwise provided, "hetero" may refer to one including 1 to 3 hetero atoms selected from the group consisting of N, O, S, and P, and remaining carbons in one functional group.

In the specification, when a definition is not otherwise provided, "alkyl group" may refer to "a saturated group" without any alkene group or alkyne group; or "an unsaturated alkyl group" with at least one alkene group or alkyne group. The "alkene group" may refer to a substituent of at least one carbon-carbon double bond of at least two carbons, and the "alkyne group" may refer to a substituent of at least one carbon-carbon triple bond of at least two carbons. The alkyl group may be branched, linear, or cyclic.

The alkyl group may be a C1 to C20 alkyl group, and specifically a C1 to C6 lower alkyl group, a C7 to C10 medium-sized alkyl group, or a C11 to C20 higher alkyl group.

For example, a C1 to C4 alkyl group may have 1 to 4 carbon atoms and may be selected from the group consisting of methyl, ethyl, propyl, iso-propyl, n-butyl, iso-butyl, sec-butyl, and t-butyl.

Typical examples of alkyl group may be a methyl group, an ethyl group, a propyl group, an isopropyl group, a butyl group, an isobutyl group, a t-butyl group, a pentyl group, a hexyl group, an ethenyl group, a propenyl group, a butenyl group, a cyclopropyl group, a cyclobutyl group, a cyclopentyl group, a cyclohexyl group, and the like.

"Aromatic group" may refer to a substituent including all element of the cycle having p-orbitals which form conjugation. Examples may include an aryl group and a heteroaryl group.

"Aryl group" may refer to a monocyclic or fused ring polycyclic (i.e., rings sharing adjacent pairs of carbon atoms) substituent.

"Heteroaryl group" may refer to an aryl group including 1 to 3 hetero atoms selected from the group consisting of N, O, S, and P, and remaining carbons in one functional group. The aryl group may be a fused ring cyclic group where each cycle may include the 1 to 3 heteroatoms.

"spiro structure" may refer to a plurality of cyclic structures having a contact point of one carbon. The spiro structure may include a compound having a spiro structure or a substituent having a spiro structure.

A compound for an organic optoelectronic device according to an embodiment may have a structure including a fluorene core structure and a substituent having hole characteristics and a substituent having electron characteristics.

In this specification, hole characteristics refer to a characteristic in which a hole formed in the anode is easily injected into the emission layer and transported in the emission layer due to conductive characteristic according to HOMO level. In this specification, electron characteristics refer to a characteristic in which an electron formed in the cathode is easily injected into the emission layer and transported in the emission layer due to conductive characteristics according to LUMO level.

Accordingly, the compound includes both the substituent having improved hole characteristics and the substituent having improved electron characteristics and thus may satisfy requirements of an emission layer. For example, the compound may be used as a host material for an emission layer.

In addition, the core structure may include a substituent having hole characteristics and a substituent having electron characteristics, while an sp$^3$ carbon of the fluorene core is bonded therebetween. Thus, the compound may have improved asymmetric bipolar characteristics. The structure of the asymmetric bipolar characteristics may help improve hole and electron transport capabilities and thus may help improve luminous efficiency and performance of a device.

The compound for an organic optoelectronic device may include a core moiety and various substituents for substituting the core moiety and thus may have various energy band gaps. Accordingly, the compound may be used in an electron injection layer (EIL) and/or transport layer or a hole injection layer (HIL) and/or transport layer.

The compound may have an appropriate energy level depending on the substituents. Thus, the compound may have similar hole transport rate to electron transport rate and bring about excellent effects on efficiency and driving voltage and also, may have excellent electrochemical and thermal stability and thus, improve life-span characteristic during the operation of the organic optoelectronic device.

According to an embodiment, a compound for an organic optoelectronic device may be represented by the following Chemical Formula 1.

[Chemical Formula 1]

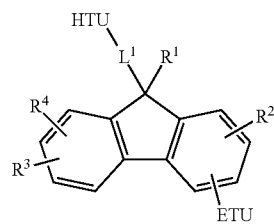

In the above Chemical Formula 1, HTU may be a substituent having hole characteristics, ETU may be a substituent having electron characteristics, L$^1$ may be a single bond, a substituted or unsubstituted C2 to C6 alkenylene group, a substituted or unsubstituted C2 to C6 alkynylene group, a substituted or unsubstituted C6 to C30 arylene group, a substituted or unsubstituted C2 to C30 heteroarylene group, or a combination thereof, R$^1$ to R$^4$ may each independently be hydrogen, a substituted or unsubstituted C1 to C6 alkyl group, a substituted or unsubstituted C6 to C30 aryl group, a substituted or unsubstituted C2 to C30 heteroaryl group, or a combination thereof. In an implementation, R$^1$, L$^1$, and HTU may be independently present or may be fused or bonded to provide a spiro structure having hole characteristics. In other words, as will be apparent to a person of ordinary skill in the art from the foregoing description, R$^1$, L$^1$, and HTU may be bound together to form a substituent having hole characteristics, and the substituent having hole characteristics may be bound to the fluorene moiety via a single carbon, such that the compound has a spiro structure.

A substituent having a π-bond of the L$^1$ may increase a triplet energy band gap by controlling a total π-conjugation length of a compound, so as to be very usefully applied to the emission layer of an organic optoelectronic device as phosphorescent host.

The R$^1$ to R$^4$ may be adjusted or selected to make the structure of the compound bulky and thus decrease crystallinity of the compound. Accordingly, the compound having low crystallinity may help improve life-span of a device.

The ETU substituent may be, e.g., a substituted or unsubstituted imidazolyl group, a substituted or unsubstituted triazolyl group, a substituted or unsubstituted tetrazolyl group, a substituted or unsubstituted oxadiazolyl group, a substituted or unsubstituted oxatriazolyl group, a substituted or unsubstituted thiatriazolyl group, a substituted or unsubstituted benzimidazolyl group, a substituted or unsubstituted benzotriazolyl group, a substituted or unsubstituted pyridinyl group, a substituted or unsubstituted pyrimidinyl group, a substituted or unsubstituted triazinyl group, a substituted or unsubstituted pyrazinyl group, a substituted or unsubstituted pyridazinyl group, a substituted or unsubstituted purinyl group, a substituted or unsubstituted quinolinyl group, a substituted or unsubstituted isoquinolinyl group, a substituted or unsubstituted phthalazinyl group, a substituted or unsubstituted naphpyridinyl group, a substituted or unsubstituted quinoxalinyl group, a substituted or unsubstituted quinazolinyl group, a substituted or unsubstituted acridinyl group, a substituted or unsubstituted phenanthrolinyl group, a substituted or unsubstituted phenazinyl group, a substituted or unsubstituted triperylenyl group, a substituted or unsubstituted triphenylenyl group, or a combination thereof.

Of the above substituents, the triphenylenyl group has a bulky structure and may cause a resonance effect. Thus, a side reaction possibly occurring in a solid state may be suppressed and performance of an organic optoelectronic device may be improved. In addition, the triphenylenyl group makes the compound bulky and thus, may have an effect on lowering crystallinity and increasing life-span.

The triphenylenyl group may have a wider band gap and high triplet excitation energy, unlike different substituents. Thus, the triphenylenyl group may be bonded with carbazole or fluorene without decreasing the band gap or triplet excitation energy of the compound.

The HTU of the substituent having hole characteristics may be, e.g., an amine group, a substituted or unsubstituted carbazolyl group, a substituted or unsubstituted acridinyl group, a substituted or unsubstituted indolocarbazolyl group, or a combination thereof.

In an implementation, the compound for an organic optoelectronic device may be represented by the following Chemical Formula 2.

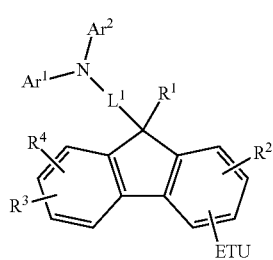

[Chemical Formula 2]

In the above Chemical Formula 2, ETU, $R^1$ to $R^4$, and $L^1$ may be the same as described in the above Chemical Formula 1, and thus descriptions thereof are not provided.

$Ar^1$ and $Ar^2$ may be substituents of an amine having excellent hole characteristics. When an amine is present as a substituent, hole injection and transport may be easily realized, and a fast driving voltage of a device may be realized.

Depending on desired effects to be obtained, substituents of the amine may be selected. Examples of the $Ar^1$ and $Ar^2$ may include a substituted or unsubstituted phenyl group, a substituted or unsubstituted naphthalenyl group, a substituted or unsubstituted fluorenyl group, a substituted or unsubstituted biphenyl group, a substituted or unsubstituted dibenzofuranyl group, a substituted or unsubstituted dibenzothiophenyl group, a substituted or unsubstituted anthracenyl group, a substituted or unsubstituted phenanthryl group, a substituted or unsubstituted naphthacenyl group, a substituted or unsubstituted pyrenyl group, a substituted or unsubstituted biphenylyl group, a substituted or unsubstituted p-terphenyl group, a substituted or unsubstituted m-terphenyl group, a substituted or unsubstituted chrysenyl group, a substituted or unsubstituted triperylenyl group, a substituted or unsubstituted perylenyl group, a substituted or unsubstituted indenyl group, a substituted or unsubstituted furanyl group, a substituted or unsubstituted thiophenyl group, a substituted or unsubstituted pyrrolyl group, a substituted or unsubstituted pyrazolyl group, a substituted or unsubstituted imidazolyl group, a substituted or unsubstituted triazolyl group, a substituted or unsubstituted oxazolyl group, a substituted or unsubstituted thiazolyl group, a substituted or unsubstituted oxadiazolyl group, a substituted or unsubstituted thiadiazolyl group, a substituted or unsubstituted pyridyl group, a substituted or unsubstituted pyrimidinyl group, a substituted or unsubstituted pyrazinyl group, a substituted or unsubstituted triazinyl group, a substituted or unsubstituted benzofuranyl group, a substituted or unsubstituted benzothiophenyl group, a substituted or unsubstituted benzimidazolyl group, a substituted or unsubstituted indolyl group, a substituted or unsubstituted quinolinyl group, a substituted or unsubstituted isoquinolinyl group, a substituted or unsubstituted quinazolinyl group, a substituted or unsubstituted quinoxalinyl group, a substituted or unsubstituted naphthyridinyl group, a substituted or unsubstituted benzoxazinyl group, a substituted or unsubstituted benzthiazinyl group, a substituted or unsubstituted acridinyl group, a substituted or unsubstituted phenazinyl group, a substituted or unsubstituted phenothiazinyl group, a substituted or unsubstituted phenoxazinyl group, or a combination thereof.

In an implementation, the compound for an organic optoelectronic device may be represented by the following Chemical Formula 3.

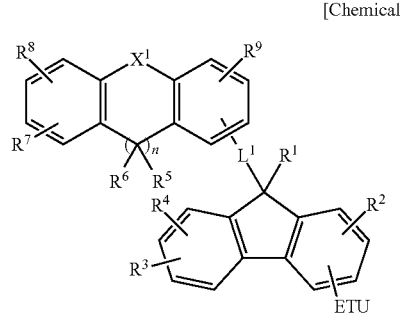

[Chemical Formula 3]

In the above Chemical Formula 3, $R^1$ to $R^9$ may each independently be hydrogen, a substituted or unsubstituted C1 to C6 alkyl group, a substituted or unsubstituted C6 to C30 aryl group, a substituted or unsubstituted C2 to C30 heteroaryl group, or a combination thereof. $R^7$ and $R^8$ may be independently present or may be fused to an adjacent ring to provide a fused ring structure. n may be 0 or 1, $X^1$ may be NR', O, S, or P, in which R' may be hydrogen, a substituted or unsubstituted C1 to C20 alkyl group, a substituted or unsubstituted C6 to C30 aryl group, a substituted or unsubstituted C3 to C30 heteroaryl group, or a combination thereof. In the above Chemical Formula 3, ETU and $L^1$ may be the same as described in the above Chemical Formula 1 and thus descriptions thereof are not provided.

In the above Chemical Formula 3, a structure that is bonded to a fluorene core through $L^1$ may be a substituent having an improved hole characteristics structure. Depending on selection of the $X^1$, hole characteristics may be appropriately adjusted.

In an implementation, a compound having the structure of the above Chemical Formula 3 may be represented by the following Chemical Formula 4.

[Chemical Formula 4]

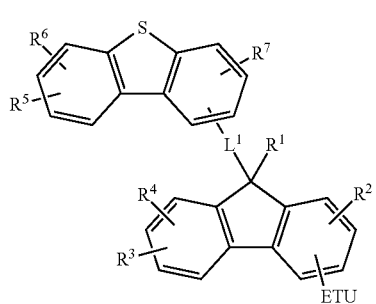

The structure of the above Chemical Formula 4 is a structure where n is 0 and $X^1$ is S in the above Chemical Formula 3. The structure includes a substituted or unsubstituted dibenzothiophenyl group as a substituent having improved hole characteristics. A compound having the substituted or unsubstituted thiophenyl group as a substituent may help control balance of a device easily.

In the above Chemical Formula 4, descriptions of $R^1$ to $R^7$ are the same as $R^1$ to $R^4$ of the above Chemical Formula 1, and $L^1$ and ETU are the same as in the above Chemical Formula 3 and thus descriptions thereof are not provided.

In an implementation, the compound for an organic optoelectronic device may be represented by the following Chemical Formula 5.

[Chemical Formula 5]

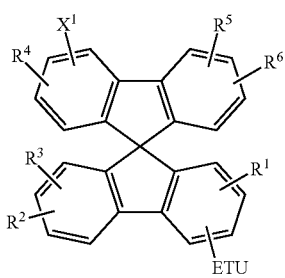

In the above Chemical Formula 5, ETU may be a substituent having electron characteristics, $R^1$ to $R^6$ may each independently be hydrogen, a substituted or unsubstituted C1 to C6 alkyl group, a substituted or unsubstituted C6 to C30 aryl group, a substituted or unsubstituted C2 to C30 heteroaryl group, or a combination thereof, $X^1$ may be a substituent having hole characteristics, and $X^1$ and $R^4$ may each independently be present or may be fused to an adjacent ring to provide a fused ring structure having hole characteristics.

In the above Chemical Formula 5, the substituent of $X^1$ may be a substituent corresponding to HTU in the above Chemical Formula 1. In an implementation, $X^1$ and $R^4$ may form a fused ring with an adjacent ring.

The ETU may be the same as in the above Chemical Formula 1 and thus descriptions thereof are not provided.

In an implementation, the $X^1$ may be NR'R". For example, R' and R" may each independently be a substituted or unsubstituted C6 to C30 aryl group or a substituted or unsubstituted C2 to C30 heteroaryl group. The $X^1$ may be a amine group that is a substituent having improved hole characteristics. The amine group may be the same as in the above Chemical Formula 2 and thus descriptions thereof are not provided.

In an implementation, the compound for an organic optoelectronic device may be represented by one of the following Chemical Formulae a-1 to a-9.

[Chemical Formula a-1]

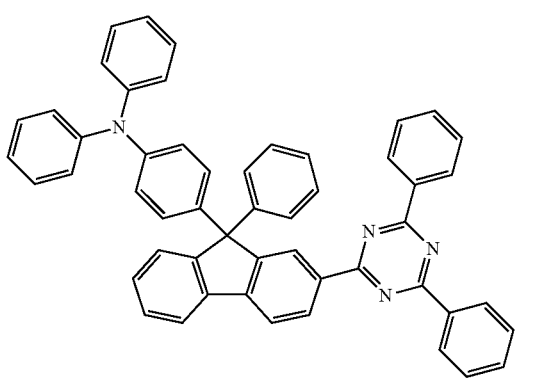

[Chemical Formula a-2]

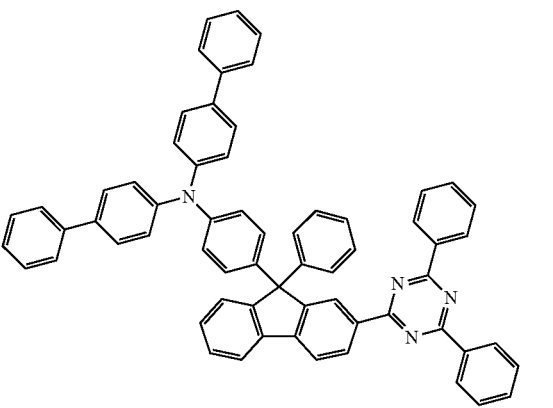

[Chemical Formula a-3]

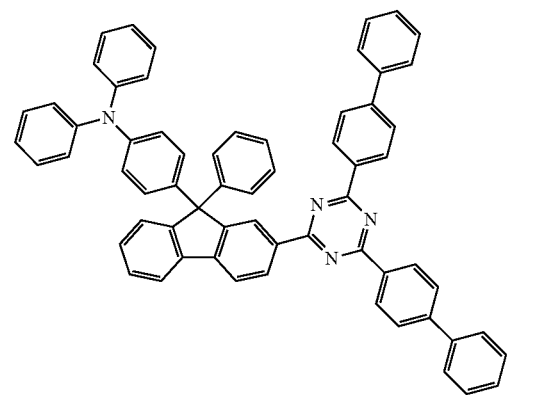

[Chemical Formula a-4]
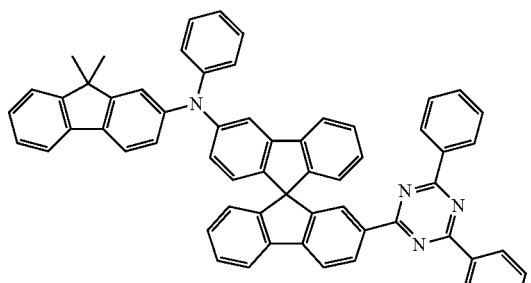
[Chemical Formula a-5]
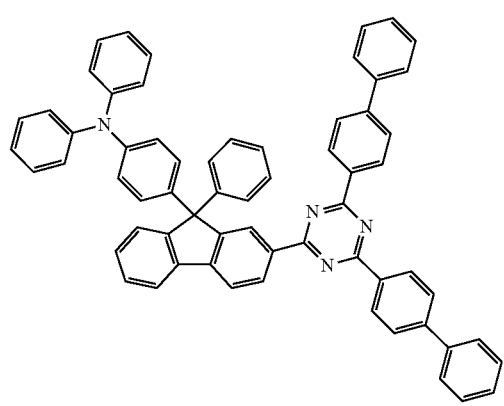
[Chemical Formula a-6]
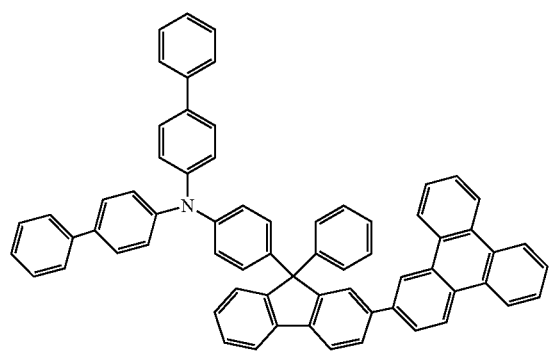
[Chemical Formula a-7]
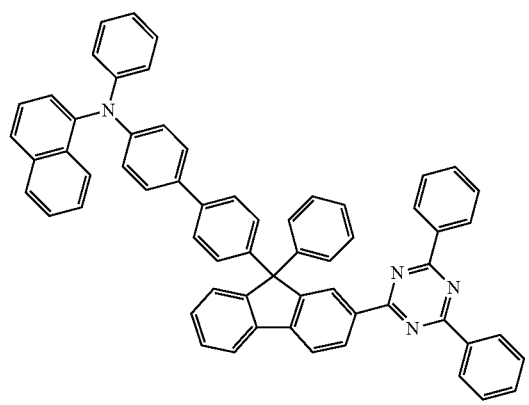
[Chemical Formula a-8]
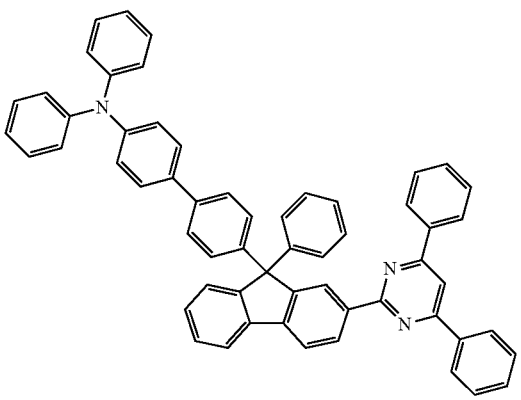
[Chemical Formula a-9]
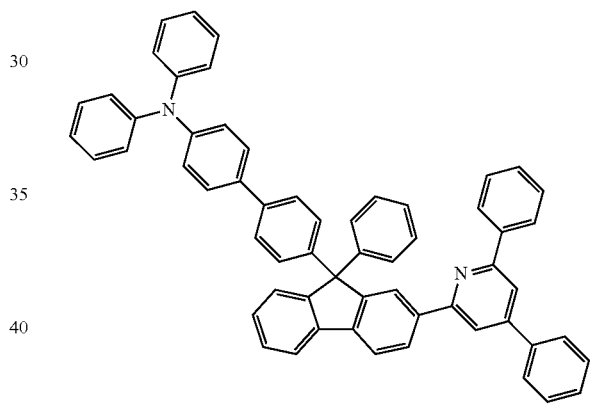
In an implementation, the compound for an organic optoelectronic device may be represented by one of the following Chemical Formulae b-1 to b-7.
[Chemical Formula b-1]
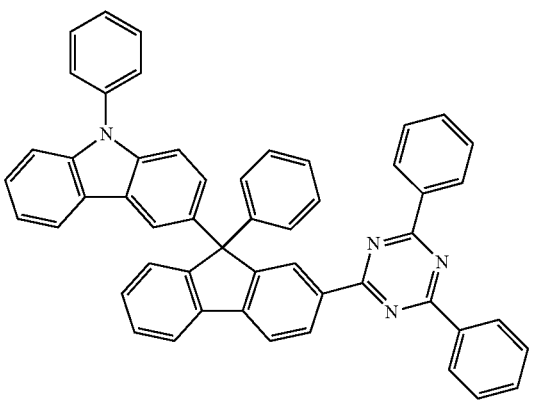

[Chemical Formula b-2]
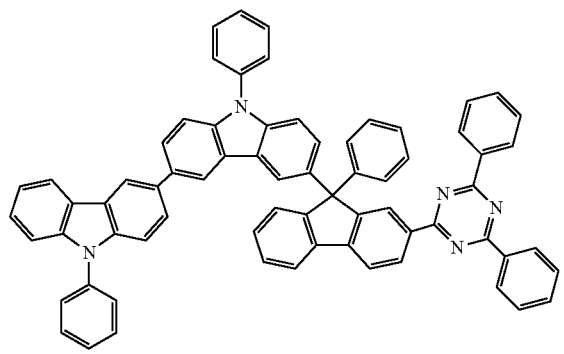
[Chemical Formula b-3]
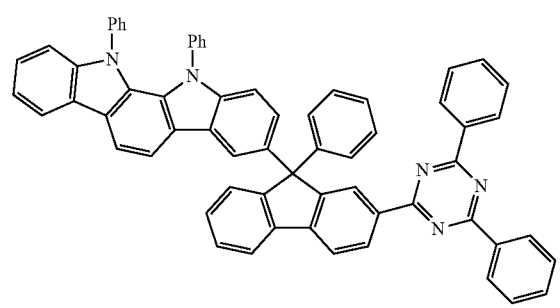
[Chemical Formula b-4]
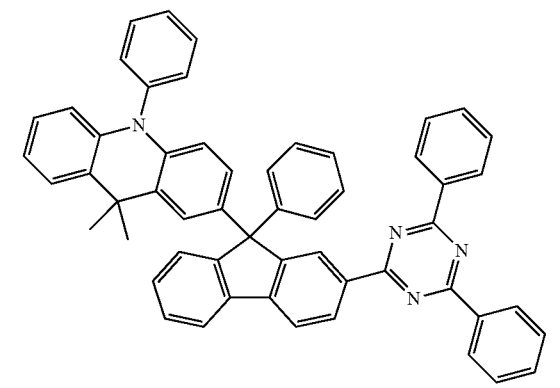
[Chemical Formula b-5]
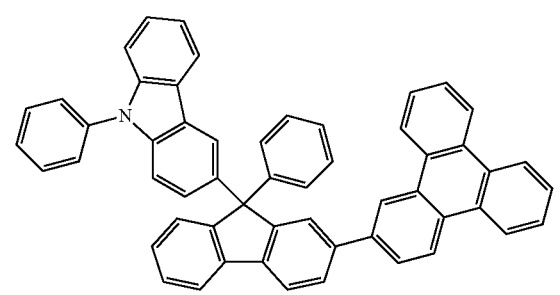
[Chemical Formula b-6]
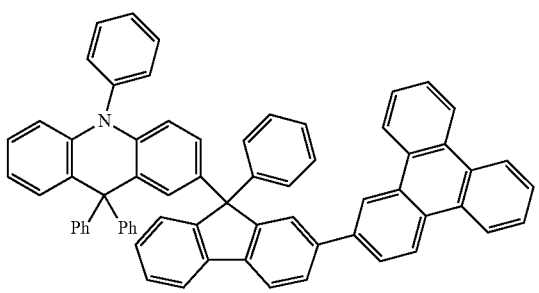
[Chemical Formula b-7]
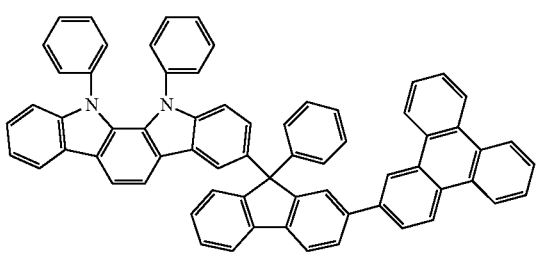
In an implementation, the compound for an organic optoelectronic device may be represented by one of the following Chemical Formulae c-1 to c-8.
[Chemical Formula c-1]
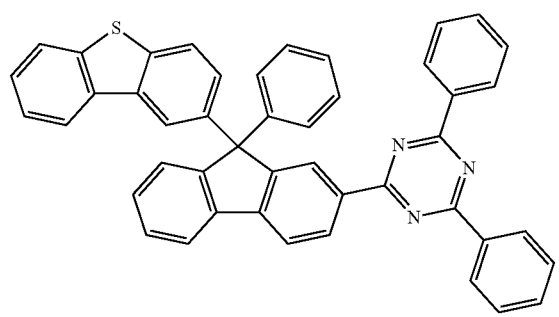
[Chemical Formula c-2]
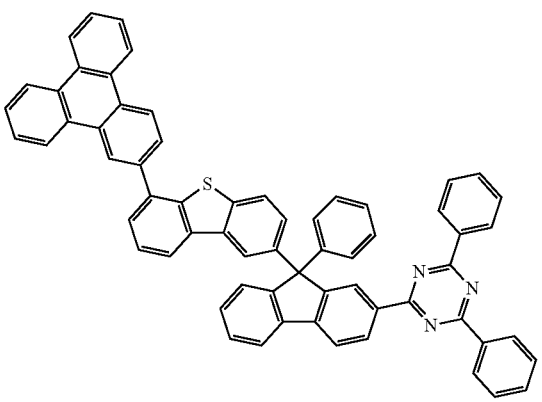

[Chemical Formula c-3]
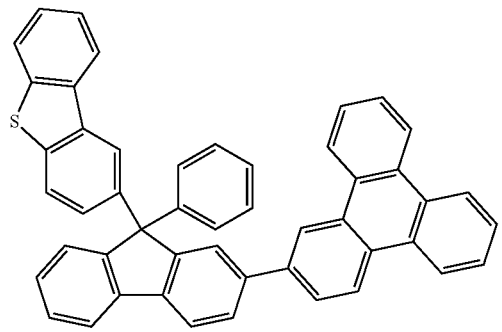
[Chemical Formula c-4]
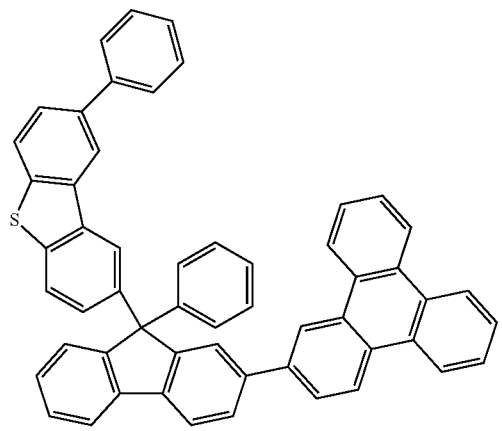
[Chemical Formula c-5]
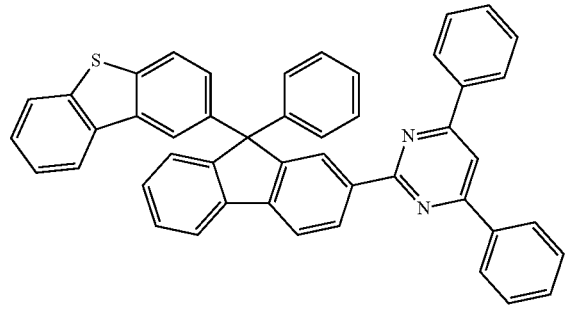
[Chemical Formula c-6]
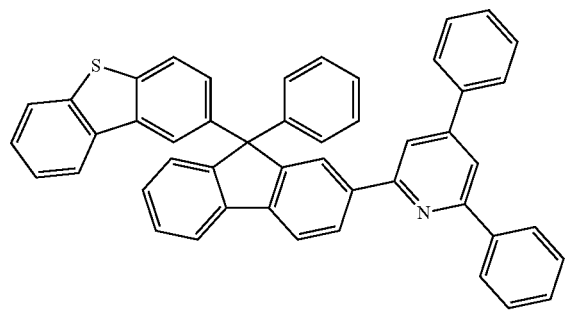
[Chemical Formula c-7]
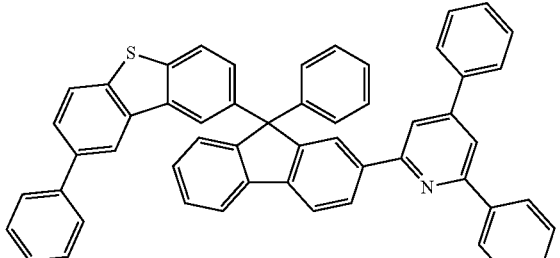
[Chemical Formula c-8]
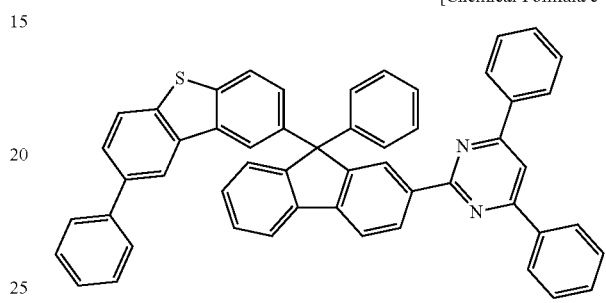
In an implementation, the compound for an organic optoelectronic device may be represented by one of the following Chemical Formulae d-1 to d-7.
[Chemical Formula d-1]
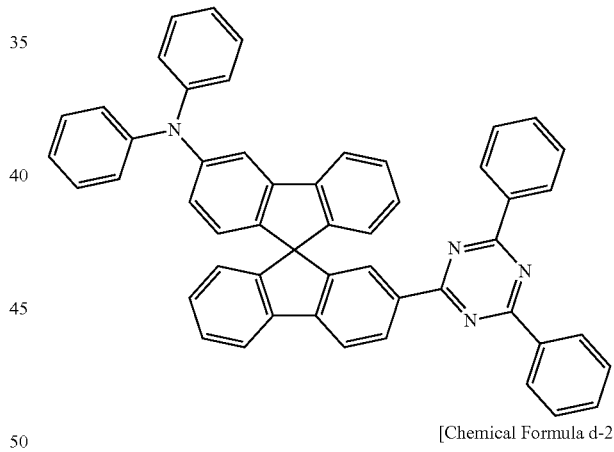
[Chemical Formula d-2]
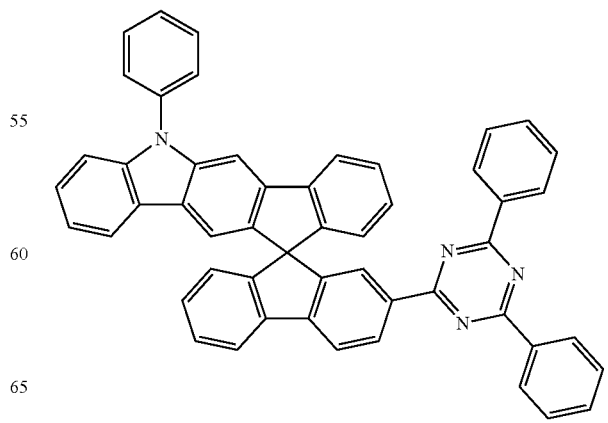

[Chemical Formula d-3]

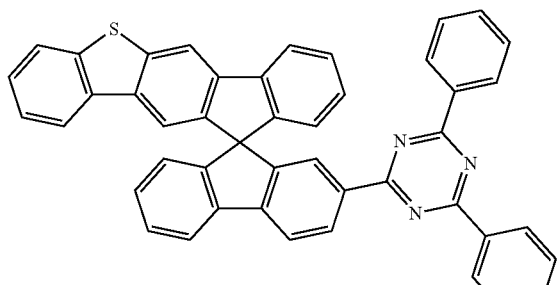

[Chemical Formula d-4]

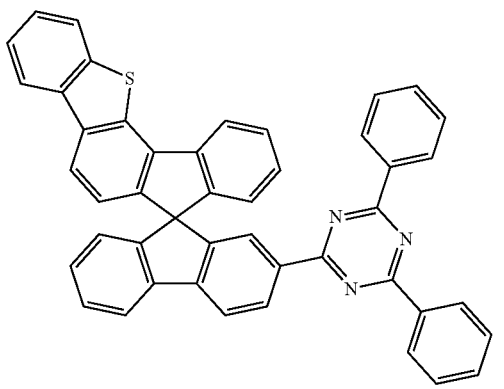

[Chemical Formula d-5]

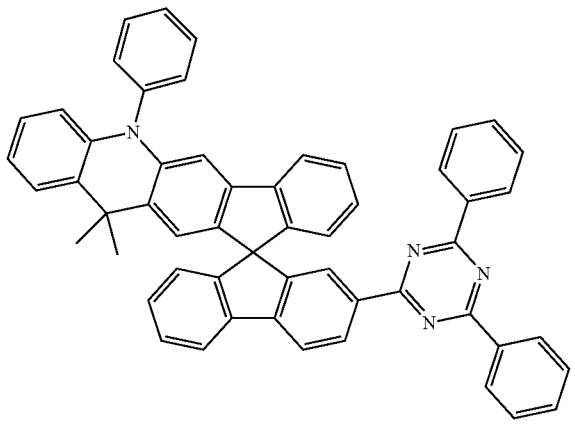

[Chemical Formula d-6]

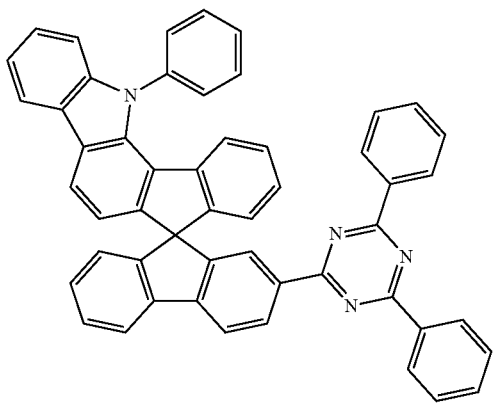

[Chemical Formula d-7]

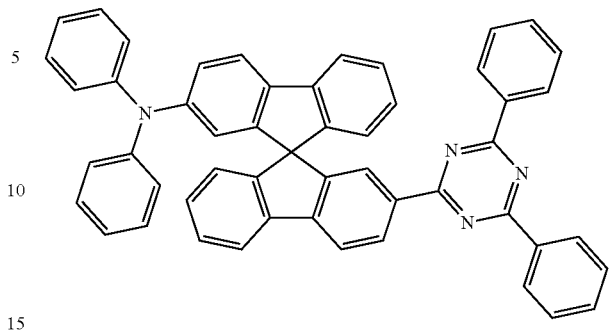

The compound for an organic optoelectronic device, e.g., including the above compounds, may have a glass transition temperature of greater than or equal to 110° C. and a thermal decomposition temperature of greater than or equal to 400° C., indicating improved thermal stability. Accordingly, it is possible to produce an organic optoelectronic device having a high efficiency.

The compound for an organic optoelectronic device, e.g., including the above compounds, may play a role for emitting light or injecting and/or transporting electrons, and also act as a light emitting host with an appropriate dopant. For example, the compound for an organic optoelectronic device may be used as a phosphorescent or fluorescent host material, a blue light emitting dopant material, or an electron transport material.

The compound for an organic optoelectronic device according to an embodiment may be used for an organic thin layer, and it may improve the life-span characteristic, efficiency characteristic, electrochemical stability, and thermal stability of an organic optoelectronic device and decrease the driving voltage.

According to another embodiment, an organic optoelectronic device that includes the compound for an organic optoelectronic device is provided. The organic optoelectronic device may include, e.g., an organic photoelectric device, an organic light emitting diode, an organic solar cell, an organic transistor, an organic photo conductor drum, an organic memory device, and the like. For example, the compound for an organic optoelectronic device according to one embodiment may be included in an electrode or an electrode buffer layer in the organic solar cell to help improve the quantum efficiency, and/or it may be used as an electrode material for a gate, a source-drain electrode, or the like in the organic transistor.

Hereinafter, an organic light emitting diode is described. For example, another embodiment provides an organic light emitting diode that includes an anode, a cathode, and at least one or more organic thin layer between the anode and the cathode. At least one of the organic thin layer may include the compound for an organic optoelectronic device according to one embodiment.

The organic thin layer that may include the compound for an organic optoelectronic device may include a layer selected from the group of an emission layer, a hole transport layer (HTL), a hole injection layer (HIL), an electron transport layer (ETL), an electron injection layer (EIL), a hole blocking layer, and a combination thereof. The at least one layer includes the compound for an organic optoelectronic device according to one embodiment. Particularly, the compound for an organic optoelectronic device according to one embodiment may be included in an electron transport layer (ETL) or an electron injection layer (EIL). In addition, when the compound for an organic optoelectronic device is included in the emission layer, the compound for an organic optoelectronic device may be included as a phosphorescent or fluorescent host and/or as a fluorescent blue dopant material.

FIGS. 1 to 5 illustrate cross-sectional views showing organic light emitting diodes including the compound for an organic optoelectronic device according to an embodiment.

Referring to FIGS. 1 to 5, organic light emitting diodes 100, 200, 300, 400, and 500 according to an embodiment may include at least one organic thin layer 105 interposed between an anode 120 and a cathode 110.

The anode 120 may include an anode material having a large work function to facilitate hole injection into an organic thin layer. The anode material may include, e.g., a metal such as nickel, platinum, vanadium, chromium, copper, zinc, and gold, or alloys thereof; a metal oxide such as zinc oxide, indium oxide, indium tin oxide (ITO), and indium zinc oxide (IZO); a bonded metal and oxide such as ZnO:Al or SnO$_2$:Sb; or a conductive polymer such as poly(3-methylthiophene), poly[3,4-(ethylene-1,2-dioxy)thiophene] (PEDT), polypyrrole, and polyaniline, but is not limited thereto. In an implementation, the anode may include a transparent electrode including indium tin oxide (ITO).

The cathode 110 may include a cathode material having a small work function to facilitate electron injection into an organic thin layer. The cathode material may include, e.g., a metal such as magnesium, calcium, sodium, potassium, titanium, indium, yttrium, lithium, gadolinium, aluminum, silver, tin, and lead, or alloys thereof; or a multi-layered material such as LiF/Al, Liq/Al, LiO$_2$/Al, LiF/Ca, LiF/Al, and BaF$_2$/Ca, but is not limited thereto. In an implementation, the cathode may include a metal electrode including aluminum.

Referring to FIG. 1, the organic light emitting diode 100 may include an organic thin layer 105 including only an emission layer 130.

Figure 2:
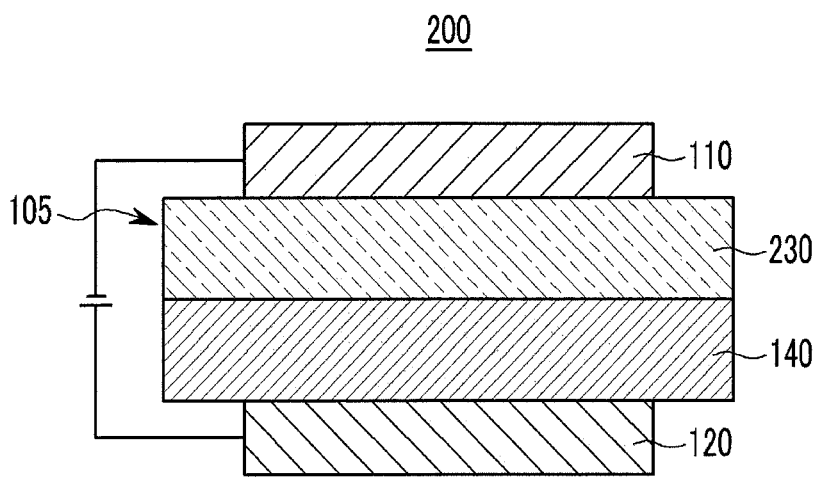

Referring to FIG. 2, a double-layered organic light emitting diode 200 may include an organic thin layer 105 including an emission layer 230 (including an electron transport layer (ETL)) and a hole transport layer (HTL) 140. As shown in FIG. 2, the organic thin layer 105 may include a double layer of the emission layer 230 and hole transport layer (HTL) 140. The emission layer 230 may also functions as an electron transport layer (ETL), and the hole transport layer (HTL) 140 layer may have an excellent binding property with a transparent electrode such as ITO or an excellent hole transport capability.

Figure 3:
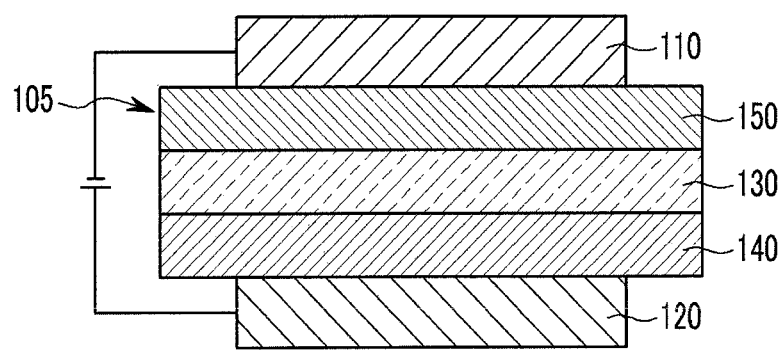

Referring to FIG. 3, a three-layered organic light emitting diode 300 may include an organic thin layer 105 including an electron transport layer (ETL) 150, an emission layer 130, and a hole transport layer (HTL) 140. The emission layer 130 may be independently installed, and layers having an excellent electron transport capability or an excellent hole transport capability may be separately stacked.

Figure 4:
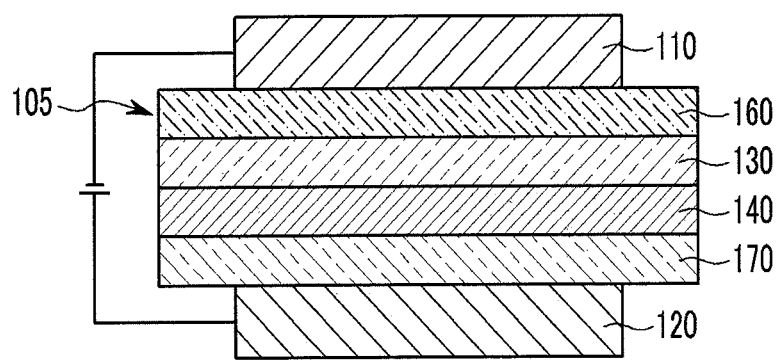

As shown in FIG. 4, a four-layered organic light emitting diode 400 may include an organic thin layer 105 including an electron injection layer (EIL) 160, an emission layer 130, a hole transport layer (HTL) 140, and a hole injection layer (HIL) 170 for adherence with the anode 120 of ITO.

Figure 5:
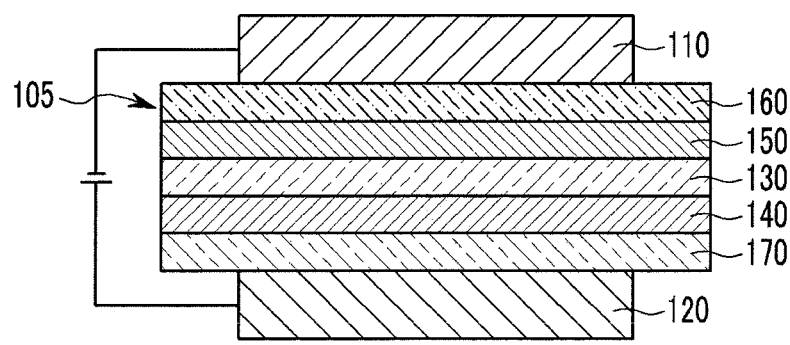

As shown in FIG. 5, a five layered organic light emitting diode 500 may include an organic thin layer 105 including an electron transport layer (ETL) 150, an emission layer 130, a hole transport layer (HTL) 140, and a hole injection layer (HIL) 170, and further includes an electron injection layer (EIL) 160 to achieve a low voltage.

In FIGS. 1 to 5, the organic thin layer 105 including at least one selected from the group of an electron transport layer (ETL) 150, an electron injection layer (EIL) 160, emission layers 130 and 230, a hole transport layer (HTL) 140, a hole injection layer (HIL) 170, and combinations thereof may include the compound for an organic optoelectronic device. The compound for an organic optoelectronic device may be used for an electron transport layer (ETL) 150 including the electron transport layer (ETL) 150 or electron injection layer (EIL) 160. When it is used for the electron transport layer (ETL), it is possible to provide an organic light emitting diode having a more simple structure because it does not require an additional hole blocking layer (not shown).

Furthermore, when the compound for an organic optoelectronic device is included in the emission layers 130 and 230, the material for the organic photoelectric device may be included as a phosphorescent or fluorescent host or a fluorescent blue dopant.

The organic light emitting diode may be fabricated by, e.g., forming an anode on a substrate; forming an organic thin layer in accordance with a dry coating method such as evaporation, sputtering, plasma plating, and ion plating or a wet coating method such as spin coating, dipping, and flow coating; and providing a cathode thereon.

Another embodiment provides a display device including the organic light emitting diode according to the above embodiment.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

Preparation of Compound for Organic Optoelectronic Device

Example 1

Synthesis of Compound Represented by Chemical Formula c-3

A compound represented by Chemical Formula c-3 (as a compound for an organic optoelectronic device) was synthesized according to the following Reaction Scheme 1.

[Reaction Scheme 1]

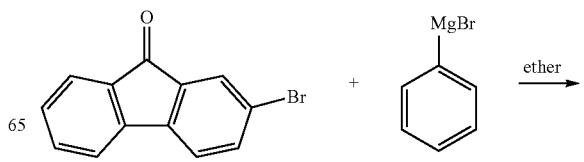

-continued

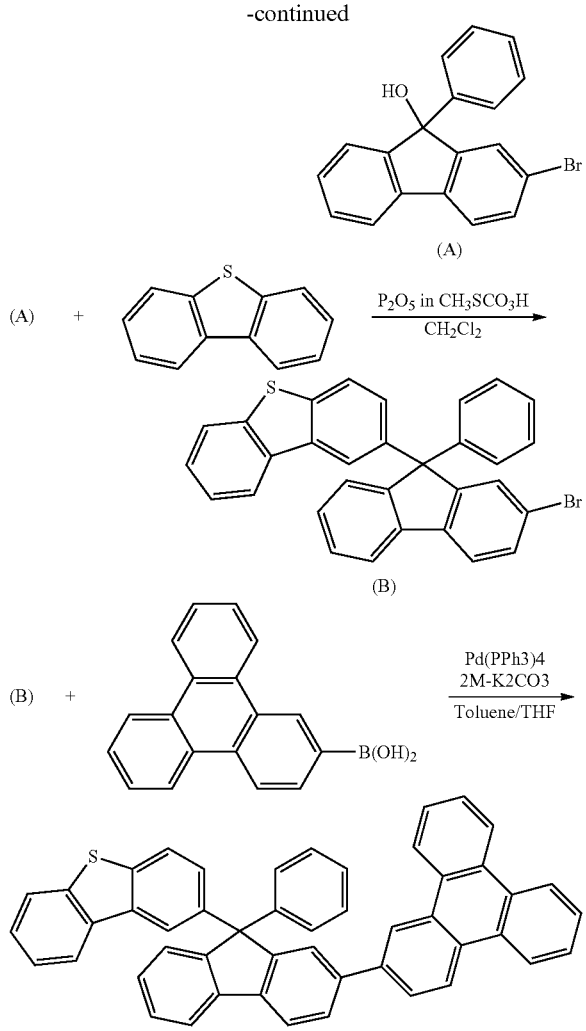

First Step: Synthesis of Compound A 12.13 g (46.8 mmol) of 2-bromofluorenone and 600 ml of diethyl ether were put in a 1,000 mL round-bottomed flask (having an agitator) under a nitrogen atmosphere and then, agitated.

The agitated mixture was cooled down to 0° C., and 14.43 g (79.6 mmol) of phenyl magnesium bromide was slowly added thereto. Then, the mixture was reacted for 12 hours. When the reaction was complete, 1 N HCl was added to the resultant, and the mixture was extracted using diethyl ether. Then, anhydrous magnesium sulfate was added thereto, and the mixture was agitated and then, filtered and concentrated. Then, hexane was used to recrystallize the concentrated product, obtaining 15 g of a compound A (yield: 95%).

Second Step: Synthesis of Compound B 15 g (44.7 mmol) of the compound A, dibenzothiophene 9.88 g (53.6 mmol) and 190 ml of methylene chloride were put in a 1,000 mL round-bottomed flask (having an agitator) under a nitrogen atmosphere and then, agitated. 3.17 g (11.17 mmol) of $P_2O_5$ in $CH_3SCO_3H$ was slowly added thereto. The mixture was reacted for 2 hours. When the reaction was complete, a sodium bicarbonate aqueous solution was added to the resultant. The mixture was extracted using methylene chloride, and anhydrous magnesium sulfate was added thereto. The obtained mixture was agitated and then, filtered and concentrated. Then, 9 g of a compound B was separated and obtained through column chromatography (yield: 40%).

Third Step: Synthesis of Compound Represented by Chemical Formula c-3

8.84 g (17.56 mmol) of the compound B, 7.17 g (26.34 mmol) of triphenylene boroic acid, and 100 mL of tetrahydrofuran and 100 ml of a 2 M potassium carbonate aqueous solution were put and mixed in a 500 mL round-bottomed flask (having an agitator) under a nitrogen atmosphere. Then, the reactants were heated and refluxed under a nitrogen flow for 12 hours. When the reaction was complete, hexane was poured into the reactants, and a solid produced therein was filtered and then, dissolved in a mixed solution prepared by mixing toluene and tetrahydrofuran in a volume ratio of 50:50. Then, activated carbon and anhydrous magnesium sulfate were added to the solution, and the mixture was agitated. The agitated product was filtered and then, recrystallized using dichloromethane and hexane, obtaining 8 g of a compound represented by Chemical Formula c-3 (yield: 70%).

calcd. C49H30S: C, 90.43; H, 4.65; S, 4.93. found: C, 90.45; H, 4.60; S, 4.95.

Example 2

Synthesis of Compound Represented by Chemical Formula c-5

A compound represented by Chemical Formula c-5 (as a compound for an organic optoelectronic device) was synthesized according to the following Reaction Scheme 2.

[Reaction Scheme 2]

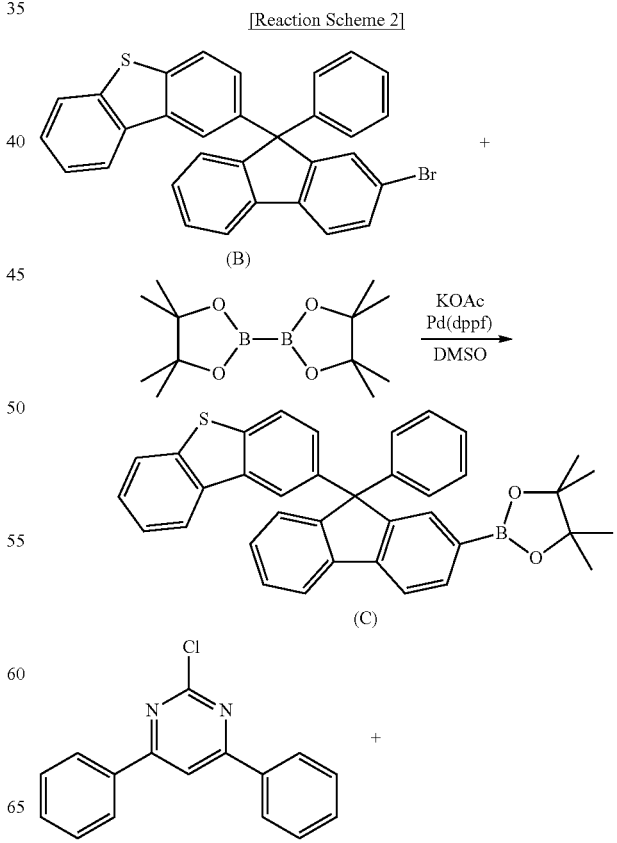

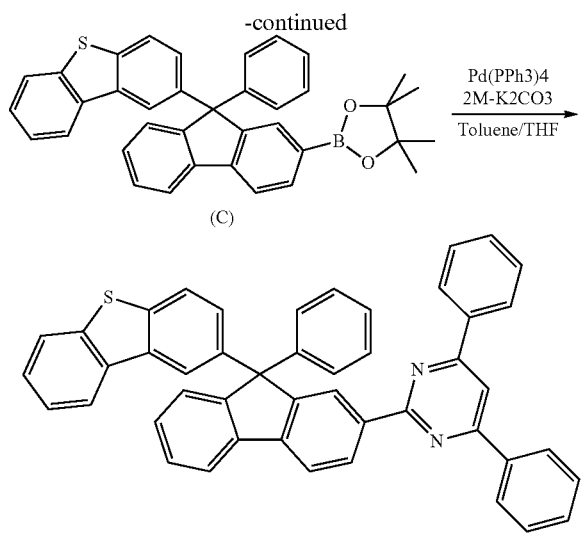

First Step: Synthesis of Compound C 8.84 g (17.56 mmol) of the compound B, 17.8 g (70.06 mmol) of bis(pinacolato)diboron, 4.6 g (46.7 mmol) of potassium acetate, 1 g (1.17 mmol) of palladium dppf, and 300 mL of dimethylsulfoxide were put and mixed in a 500 mL round-bottomed flask (having an agitator) under a nitrogen atmosphere. The mixture was heated at 100° C. for 12 hours under a nitrogen flow. When the reaction was complete, hexane was poured into the reactants, and a solid produced therein was filtered. Then, anhydrous magnesium sulfate was added to the solid, and the mixture was agitated. The agitated product was filtered and separated through column chromatography, obtaining 7.5 g of a compound C (yield: 60%).

Second Step: Synthesis of Compound represented by Chemical Formula c-5

9.08 g (16.5 mmol) of the compound C, 3.66 g (13.74 mmol) of 2-chloro 4,6diphenyl pyrimidine, and 100 mL of tetrahydrofuran and 100 ml of a 2 M potassium carbonate aqueous solution were put in a 500 mL round-bottomed flask having an agitator under a nitrogen atmosphere. Then, the reactants were heated and refluxed for 12 hours under a nitrogen flow. When the reaction was complete, hexane was poured into the reactant, and a solid produced therein was filtered and dissolved again in a solution prepared by mixing toluene and tetrahydrofuran in a volume ratio of 50:50. Then, activated carbon and anhydrous magnesium sulfate were added to the solution, and the mixture was agitated. The agitated product was filtered and recrystallized using dichloromethane and hexane, obtaining 6.3 g a compound represented by Chemical Formula c-5 (yield: 70%).

calcd. C47H30N2S: C, 86.21; H, 4.62; N, 4.28; S, 4.90. found: C, 86.20; H, 4.60; N, 4.30; S, 4.88.

Manufacture of Organic Light Emitting Diode

Example 3

Manufacture of Device Including Example 1 as Host of Emission Layer

The compound synthesized in Example 1 was used as a host, and Ir(PPy)$_3$ was used as a dopant to manufacture an organic light emitting diode. A 1,000 Å-thick ITO layer was used as an anode, while a 1,000 Å-thick aluminum (Al) layer was used as a cathode.

For example, a method of manufacturing the organic light emitting diode included cutting an ITO glass substrate having sheet resistance of 15 $\Omega/cm^2$ into a size of 50 mm×50 mm×0.7 mm and ultrasonic wave-cleaning it in acetone, isopropyl alcohol, and pure water for 15 minutes respectively and then, UV-ozone cleaning it for 30 minutes.

On the substrate, a 800 Å-thick hole transport layer (HTL) was formed by depositing N,N-di(1-naphthyl)-N,N'-diphenylbenzidine (NPB) (70 nm) and 4,4',4''-tri(N-carbazolyl) triphenylamine (TCTA) (10 nm) under conditions of a vacuum degree of 650×10$^{-7}$ Pa and a deposition rate of 0.1 to 0.3 nm/s.

Then, a 300 Å-thick emission layer was formed thereon using the compound according to Example 1 under the same vacuum deposit conditions, and Ir(PPy)$_3$ as a phosphorescent dopant was simultaneously deposited. Herein, the deposition rate of the phosphorescent dopant was adjusted to include 7 wt % of the phosphorescent dopant based on 100 wt % of the emission layer.

On the emission layer, bis(8-hydroxy-2-methylquinolinolato)-aluminumbiphenoxide (BAlq) was deposit to form a 50 Å-thick hole blocking layer under the same vacuum deposit conditions.

Subsequently, a 200 Å-thick electron transport layer (ETL) was formed thereon by depositing Alq$_3$ under the same vacuum deposit conditions.

On the electron transport layer (ETL), LiF and Al were sequentially deposited to form a cathode, manufacturing an organic light emitting diode.

The organic light emitting diode had a structure of ITO/ NPB (70 nm)/TCTA (10 nm)/EML (the compound of Example 1 (93 wt %)+Ir(PPy)$_3$ (7 wt %), 30 nm)/Balq (5 nm)/Alq$_3$ (20 nm)/LiF (1 nm)/Al (100 nm).

Example 4

An organic photoelectric device was manufactured according to the same method as Example 3 except that the compound synthesized in Example 2 was used as a host of an emission layer.

Comparative Example 1

An organic light emitting diode was manufactured according to the same method as Example 3 except that 4,4-N,N-dicarbazolebiphenyl (CBP) was used as a host of an emission layer, instead of compound synthesized in Example 1.

Comparative Example 2

An organic light emitting diode fabricated using bis[9-(4-methoxyphenyl)carbazol-3-yl] (Jib796-04k) was compared with a device fabricated using the compound according to the embodiments regarding light emitting characteristics.

Performance Measurement of Organic Light Emitting Diode

Experimental Examples

Each organic light emitting diode according to Examples 3 and 4 and Comparative Examples 1 and 2 was measured regarding current density and luminance changes depending on voltage and luminous efficiency. The measurements were specifically performed in the following method. The results are provided in the following Table 1.

(1) Measurement of Current Density Change Depending on Voltage Change

The manufactured organic light emitting diodes were measured for current value flowing in the unit device while increasing the voltage from 0 V to 10 V using a current-voltage meter (Keithley 2400), and the measured current value was divided by area to provide the result.

(2) Measurement of Luminance Change Depending on Voltage Change

The manufactured organic light emitting diodes were measured for luminance while increasing the voltage form 0 V to 10 V using a luminance meter (Minolta Cs1000A).

(3) Measurement of Luminous Efficiency

Current efficiency (cd/A) and electric power efficiency (lm/W) at the same luminance (9,000 cd/m$^2$) were calculated by using luminance and current density from the item (1) and (2) and voltage. The results are shown in the following Tables 1.

(4) Color coordinate was measured using a luminance meter (Minolta Cs100A), and the results are shown in the following Table 1.

TABLE 1

| | | 9,000 cd/m$^2$ | | |
|---|---|---|---|---|
| | Host material of emission layer | Threshold voltage (V) | Luminous efficiency (cd/A) | Electric power efficiency (lm/W) |
| Example 3 | Compound of Example 1 | 4.6 | 75.62 | 45.26 |
| Example 4 | Compound of Example 2 | 4.8 | 64.12 | 32.50 |
| Comparative Example 1 | CBP | 4.8 | 32.57 | 11.25 |
| Comparative Example 2 | bis[9-(4-methoxy-phenyl)carbazol-3-yl] | | 30 to 35 | |

Referring to Table 1, the device according to Example 3 exhibited improved driving voltage and efficiency, compared with that manufactured using CBP.

On the other hand, the device according to Comparative Example 2 exhibited luminous efficiency ranging from 30 to 35 cd/A, which was remarkably lower than that according to Example 4. Compared with the aforementioned two compounds of Comparative Examples, the compounds according to Examples 1 and 2 may be well applied to an organic light emitting diode.

By way of summation and review, an organic light emitting diode (OLED) has recently drawn attention due to an increasing demand for a flat panel display. In general, organic light emission refers to conversion of electrical energy into photo-energy.

Such an organic light emitting diode may convert electrical energy into light by applying current to an organic light emitting material. It may have a structure in which a functional organic material layer is interposed between an anode and a cathode. The organic material layer may include a multi-layer including different materials, e.g., a hole injection layer (HIL), a hole transport layer (HTL), an emission layer, an electron transport layer (ETL), and an electron injection layer (EIL), in order to help improve efficiency and stability of an organic photoelectric device.

In such an organic light emitting diode, when a voltage is applied between an anode and a cathode, holes from the anode and electrons from the cathode may be injected to the organic material layer and recombined to generate excitons having high energy. The generated excitons may generate light having certain wavelengths while shifting to a ground state.

A phosphorescent light emitting material may be used for a light emitting material of an organic light emitting diode, in addition to the fluorescent light emitting material. Such a phosphorescent material may emit light by transporting the electrons from a ground state to an exited state, non-radiance transiting of a singlet exciton to a triplet exciton through intersystem crossing, and transiting a triplet exciton to a ground state to emit light.

As described above, in an organic light emitting diode, an organic material layer may include a light emitting material and a charge transport material, e.g., a hole injection material, a hole transport material, an electron transport material, an electron injection material, and the like.

The light emitting material may be classified as blue, green, and red light emitting materials according to emitted colors, and yellow and orange light emitting materials to emit colors approaching natural colors.

When one material is used as a light emitting material, a maximum light emitting wavelength may be shifted to a long wavelength or color purity may decrease because of interactions between molecules, or device efficiency may decrease because of a light emitting quenching effect. Therefore, a host/dopant system may be included as a light emitting material in order to help improve color purity and to help increase luminous efficiency and stability through energy transfer.

In order to implement excellent performance of an organic light emitting diode, a material constituting an organic material layer, e.g., a hole injection material, a hole transport material, a light emitting material, an electron transport material, an electron injection material, and/or a light emitting material such as a host and/or a dopant, should be stable and have good efficiency. In addition, the material may be useful for other organic photoelectric devices.

A low molecular weight organic light emitting diode may be manufactured as a thin film in a vacuum deposition method and may have good efficiency and life-span performance. A polymer organic light emitting diode may be manufactured using an Inkjet or spin coating method, and may have an advantage of low initial cost and being large-sized.

Both low molecular weight organic light emitting and polymer organic light emitting diodes may have an advantage of being self-light emitting, having high speed response, wide viewing angle, ultra-thin, high image quality, durability, large driving temperature range, and the like. For example, they may have good visibility due to self-light emitting characteristics, compared with a LCD (liquid crystal display), and may have an advantage of decreasing thickness and weight of LCD up to a third, because a backlight is not required.

In addition, since they may have a response speed of a microsecond unit, which is 1,000 time faster than an LCD, they may realize a perfect motion picture without after-image. Based on these advantages, they have been remarkably developed to have 80 times efficiency and more than 100 times life-span since their initial introduction. Recently, they keep being rapidly larger such as a 40-inch organic light emitting diode panel.

Simultaneously exhibiting improved luminous efficiency and life-span in order to be larger may be particularly desirable. For example, luminous efficiency may require smooth combination between holes and electrons in an emission layer. However, an organic material in general may have slower electron mobility than hole mobility. Thus, it may exhibit an inefficient combination between holes and electrons. Accordingly, it may be desirable to increase electron injection and mobility from a cathode while simultaneously preventing movement of holes.

In order to improve life-span, a material crystallization caused by Joule heating generated during device operating should be prevented. Accordingly, the embodiments provide an organic compound having excellent electron injection and mobility, and high electrochemical stability.

The embodiments provide a compound for an organic optoelectronic device that may act as a light emitting or electron/hole injection and transport material, and also act as a light emitting host along with an appropriate dopant.

The embodiments provide an organic light emitting diode having excellent life-span, efficiency, driving voltage, electrochemical stability, and thermal stability and a display device including the same.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A compound for an organic optoelectronic device, the compound being asymmetrical and represented by the following Chemical Formula 1:

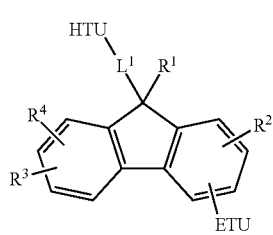

[Chemical Formula 1]

wherein, in the above Chemical Formula 1,
HTU is a substituent having hole characteristics,
ETU is a substituted or unsubstituted imidazolyl group, a substituted or unsubstituted triazolyl group, a substituted or unsubstituted tetrazolyl group, a substituted or unsubstituted oxadiazolyl group, a substituted or unsubstituted oxatriazolyl group, a substituted or unsubstituted thiatriazolyl group, a substituted or unsubstituted benzimidazolyl group, a substituted or unsubstituted benzotriazolyl group, a substituted or unsubstituted pyridinyl group, a substituted or unsubstituted pyrimidinyl group, a substituted or unsubstituted triazinyl group, a substituted or unsubstituted pyrazinyl group, a substituted or unsubstituted pyridazinyl group, a substituted or unsubstituted purinyl group, a substituted or unsubstituted quinolinyl group, a substituted or unsubstituted isoquinolinyl group, a substituted or unsubstituted phthalazinyl group, a substituted or unsubstituted naphpyridinyl group, a substituted or unsubstituted quinoxalinyl group, a substituted or unsubstituted quinazolinyl group, a substituted or unsubstituted acridinyl group, a substituted or unsubstituted phenanthrolinyl group, a substituted or unsubstituted phenazinyl group, a substituted or unsubstituted triperylenyl group, a substituted or unsubstituted triphenylenyl group, or a combination thereof,
$L^1$ is a single bond, a substituted or unsubstituted C2 to C6 alkenylene group, a substituted or unsubstituted C2 to C6 alkynylene group, a substituted or unsubstituted C6 to C30 arylene group, a substituted or unsubstituted C2 to C30 heteroarylene group, or a combination thereof,
$R^1$ to $R^4$ are each independently hydrogen, a substituted or unsubstituted C1 to C6 alkyl group, a substituted or unsubstituted C6 to C30 aryl group, a substituted or unsubstituted C2 to C30 heteroaryl group, or a combination thereof, and $R^1$, $L^1$, and HTU are independently present.

2. The compound for an organic optoelectronic device as claimed in claim 1, wherein the compound is represented by the following Chemical Formula 2:

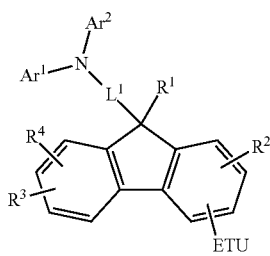

[Chemical Formula 2]

wherein, in the above Chemical Formula 2,
ETU is defined the same as ETU of Chemical Formula 1,
$L^1$ is a single bond, a substituted or unsubstituted C2 to C6 alkenylene group, a substituted or unsubstituted C2 to C6 alkynylene group, a substituted or unsubstituted C6 to C30 arylene group, a substituted or unsubstituted C2 to C30 heteroarylene group, or a combination thereof,
$R^1$ to $R^4$ are each independently hydrogen, a substituted or unsubstituted C1 to C6 alkyl group, a substituted or unsubstituted C6 to C30 aryl group, a substituted or unsubstituted C2 to C30 heteroaryl group, or a combination thereof, and
$Ar^1$ and $Ar^2$ are each independently substituted or unsubstituted C6 to C30 aryl group or a substituted or unsubstituted C2 to C30 heteroaryl group.

3. The compound for an organic optoelectronic device as claimed in claim 2, wherein $Ar^1$ and $Ar^2$ are each independently a substituted or unsubstituted phenyl group, a substituted or unsubstituted naphthalenyl group, a substituted or unsubstituted fluorenyl group, a substituted or unsubstituted biphenyl group, a substituted or unsubstituted dibenzofuranyl group, a substituted or unsubstituted dibenzothiophenyl group, a substituted or unsubstituted anthracenyl group, a substituted or unsubstituted phenanthryl group, a substituted or unsubstituted naphthacenyl group, a substituted or unsubstituted pyrenyl group, a substituted or unsubstituted biphenylyl group, a substituted or unsubstituted p-terphenyl group, a substituted or unsubstituted m-terphenyl group, a substituted or unsubstituted chrysenyl group, a substituted or unsubstituted triperylenyl group, a substituted or unsubstituted perylenyl group, a substituted or unsubstituted indenyl group, a substituted or unsubstituted furanyl group, a substituted or unsubstituted thiophenyl group, a substituted or unsubstituted pyrrolyl group, a substituted or unsubstituted pyrazolyl group, a substituted or unsubstituted imidazolyl group, a substituted or unsubstituted triazolyl group, a substituted or unsubstituted oxazolyl group, a substituted or unsubstituted thiazolyl group, a substituted or unsubstituted oxadiazolyl group, a substituted or unsubstituted thiadiazolyl group, a substituted or unsubstituted pyridyl group, a substituted or unsubstituted pyrimidinyl group, a substituted or unsubstituted pyrazinyl group, a substituted or unsubstituted triazinyl group, a substituted or unsubstituted benzofuranyl group, a substituted or unsubstituted benzothiophenyl group, a substituted or unsubstituted benzimidazolyl group, a substituted or unsubstituted indolyl group, a substituted or unsubstituted quinolinyl group, a substituted or unsubstituted isoquinolinyl group, a substituted or unsubstituted quinazolinyl group, a substituted or unsubstituted quinoxalinyl group, a substituted or unsubstituted naphthyridinyl group, a substituted or unsubstituted benzoxazinyl group, a substituted or unsubstituted benzthiazinyl group, a substituted or unsubstituted acridinyl group, a substituted or unsubstituted phenazinyl group, a substituted or unsubstituted phenothiazinyl group, a substituted or unsubstituted phenoxazinyl group, or a combination thereof.

4. The compound for an organic optoelectronic device as claimed in claim 1, wherein the compound is represented by the following Chemical Formula 3:

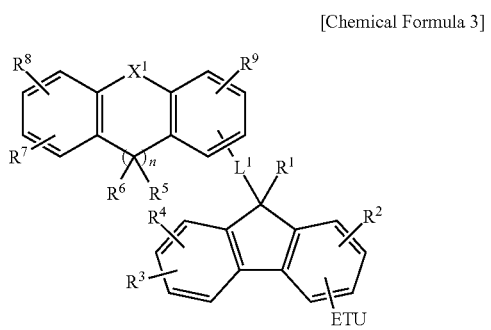

[Chemical Formula 3]

wherein, in the above Chemical Formula 3,

ETU is defined the same as ETU of Chemical Formula 1, $L^1$ is a single bond, a substituted or unsubstituted C2 to C6 alkenylene group, a substituted or unsubstituted C2 to C6 alkynylene group, a substituted or unsubstituted C6 to C30 arylene group, a substituted or unsubstituted C2 to C30 heteroarylene group, or a combination thereof, $R^1$ to $R^9$ are each independently hydrogen, a substituted or unsubstituted C1 to C6 alkyl group, a substituted or unsubstituted C6 to C30 aryl group, a substituted or unsubstituted C2 to C30 heteroaryl group, or a combination thereof, $R^7$ and $R^8$ being independently present or fused to an adjacent ring to provide a fused ring structure, n is 0 or 1, and $X^1$ is NR', O, S, or P, in which R' is hydrogen, a substituted or unsubstituted C1 to C20 alkyl group, a substituted or unsubstituted C6 to C30 aryl group, a substituted or unsubstituted C3 to C30 heteroaryl group, or a combination thereof.

5. The compound for an organic optoelectronic device as claimed in claim 1, wherein the compound is represented by the following Chemical Formula 4:

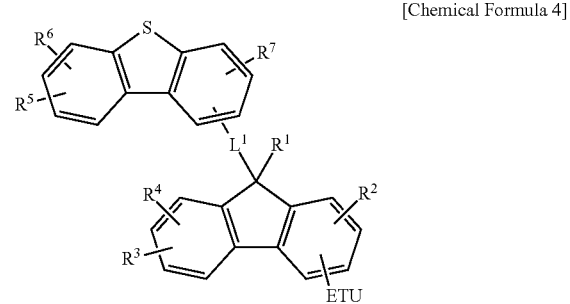

[Chemical Formula 4]

wherein, in the above Chemical Formula 4,

ETU is defined the same as ETU of Chemical Formula 1, $L^1$ is a single bond, a substituted or unsubstituted C2 to C6 alkenylene group, a substituted or unsubstituted C2 to C6 alkynylene group, a substituted or unsubstituted C6 to C30 arylene group, a substituted or unsubstituted C2 to C30 heteroarylene group, or a combination thereof, and $R^1$ to $R^7$ are each independently hydrogen, a substituted or unsubstituted C1 to C6 alkyl group, a substituted or unsubstituted C6 to C30 aryl group, a substituted or unsubstituted C2 to C30 heteroaryl group, or a combination thereof.

6. The compound for an organic optoelectronic device as claimed in claim 1, wherein the compound is represented by one of the following Chemical Formulae a-1 to a-9, Chemical Formulae b-1 to b-7, and Chemical Formulae c-1 to c-8:

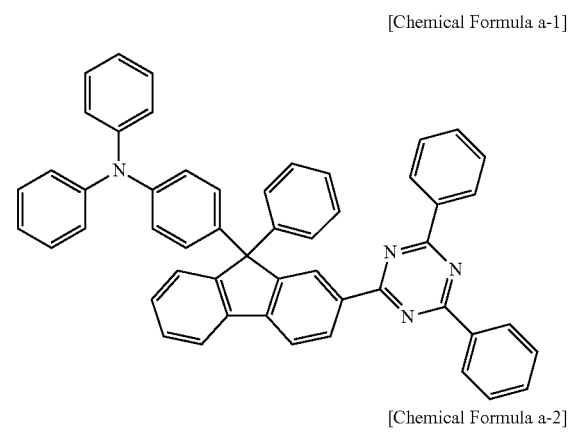

[Chemical Formula a-1]

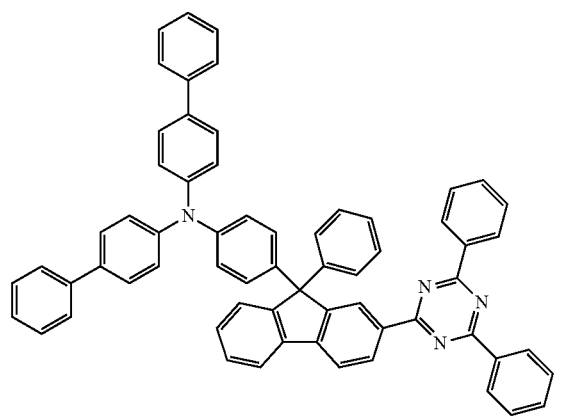

[Chemical Formula a-2]

[Chemical Formula a-3]
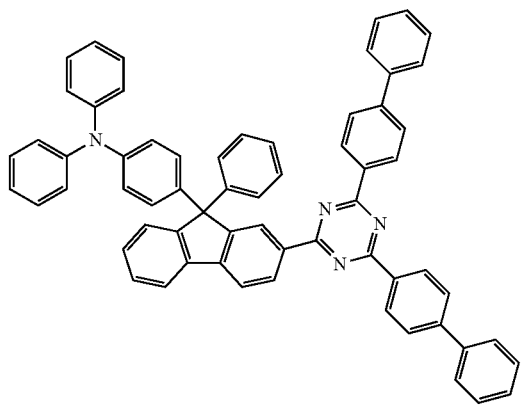
[Chemical Formula a-4]
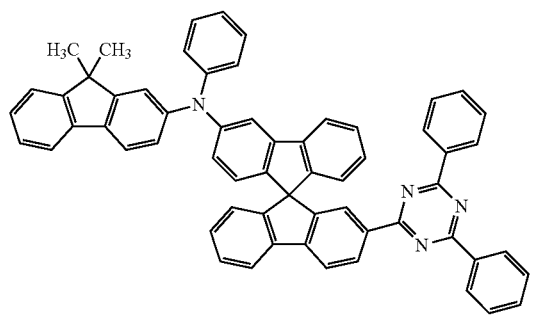
[Chemical Formula a-5]
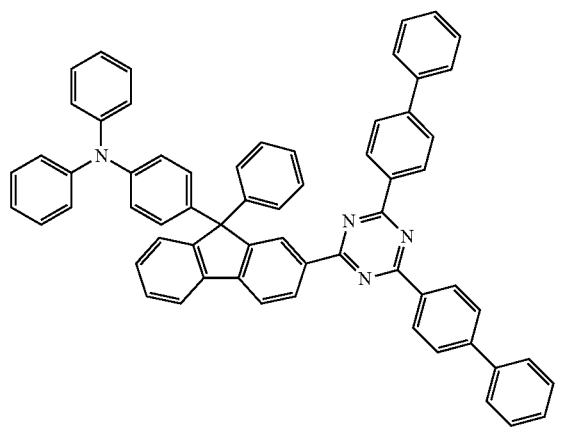
[Chemical Formula a-6]
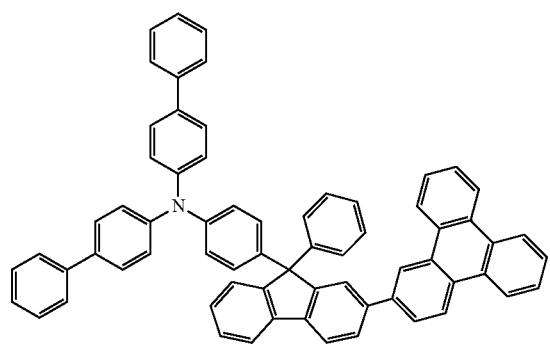
[Chemical Formula a-7]
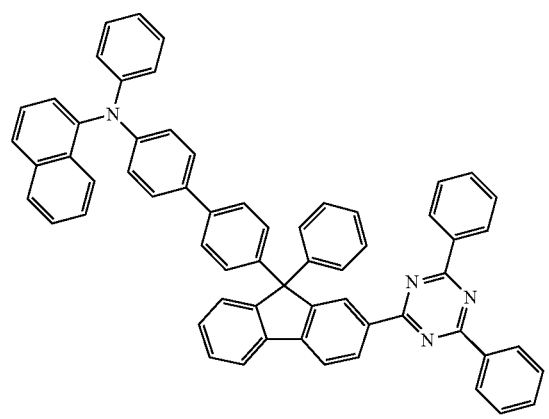
[Chemical Formula a-8]
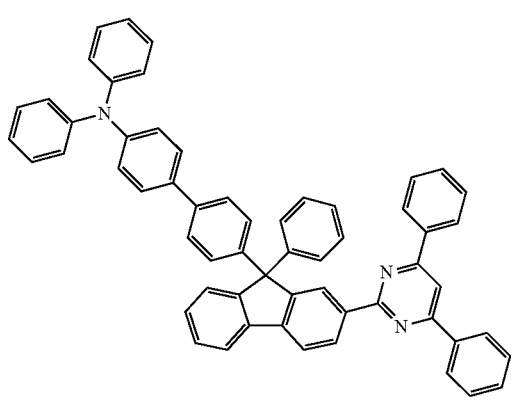
[Chemical Formula a-9]
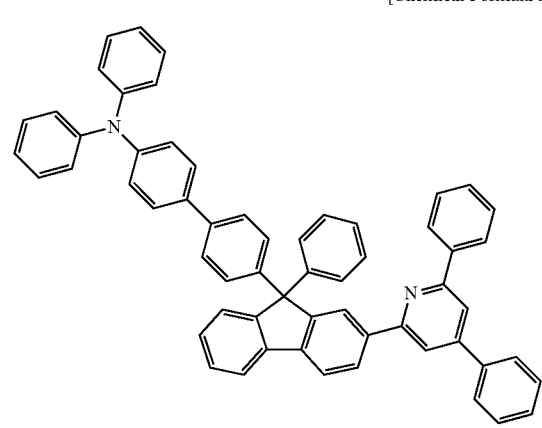
[Chemical Formula b-1]
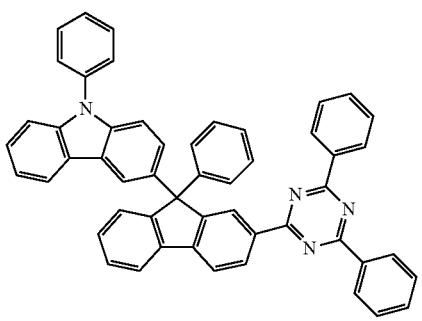

[Chemical Formula b-2]
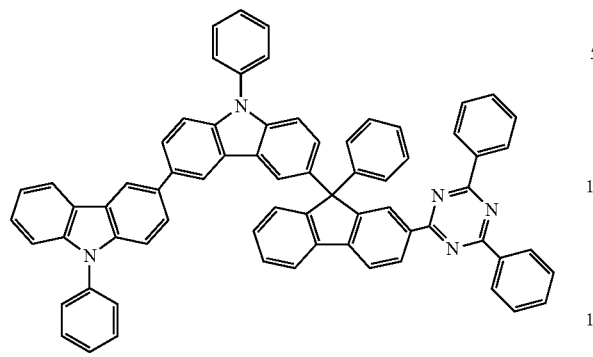
[Chemical Formula b-3]
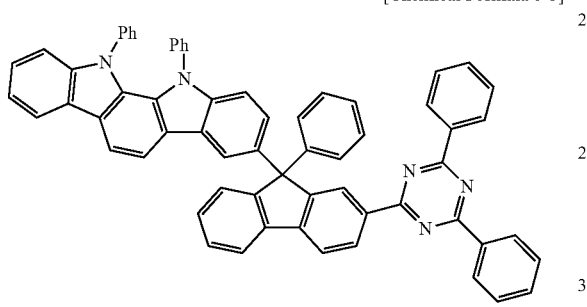
[Chemical Formula b-4]
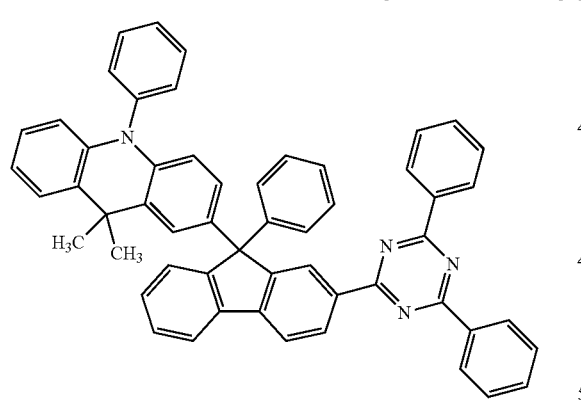
[Chemical Formula b-5]
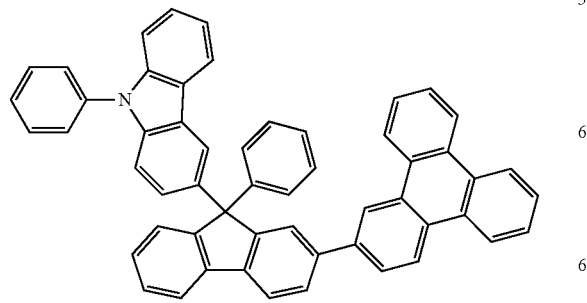
[Chemical Formula b-6]
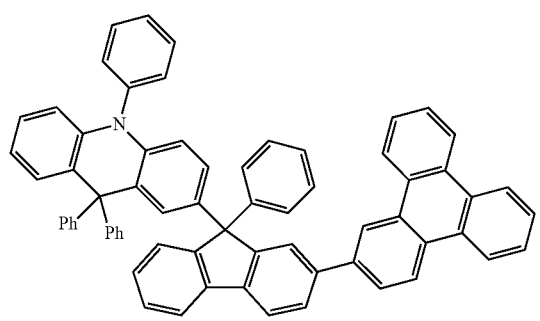
[Chemical Formula b-7]
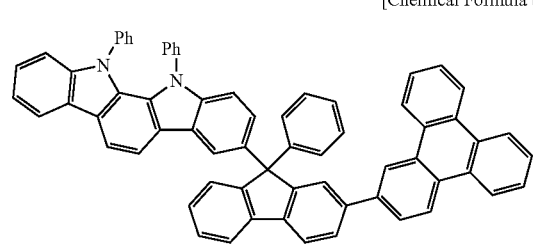
[Chemical Formula c-1]
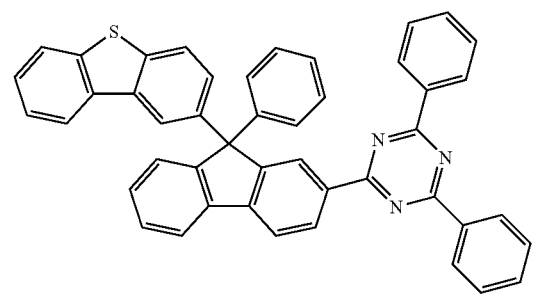
[Chemical Formula c-2]

[Chemical Formula c-3]

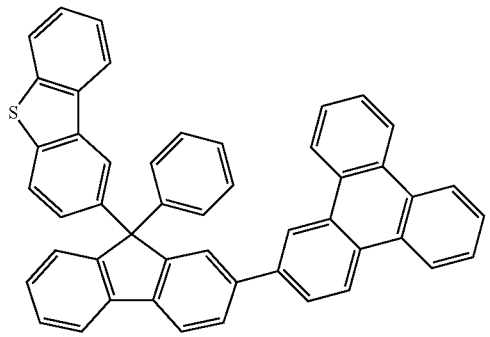

[Chemical Formula c-4]

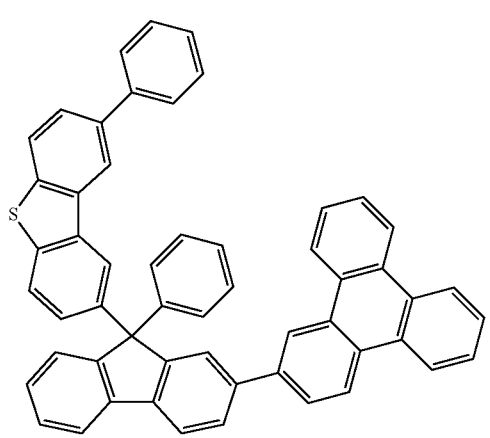

[Chemical Formula c-5]

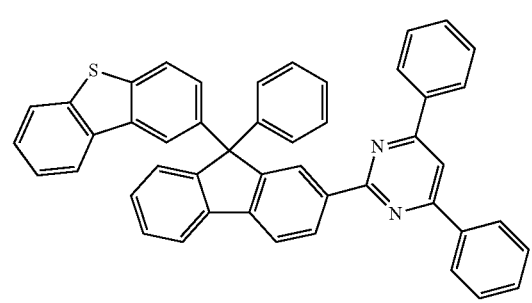

[Chemical Formula c-6]

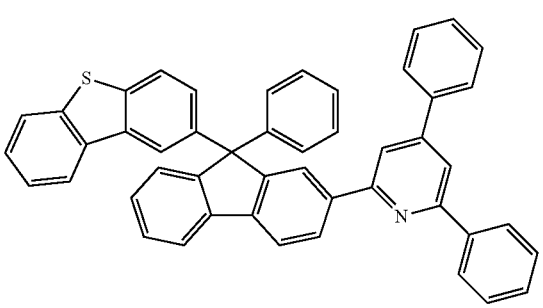

[Chemical Formula c-7]

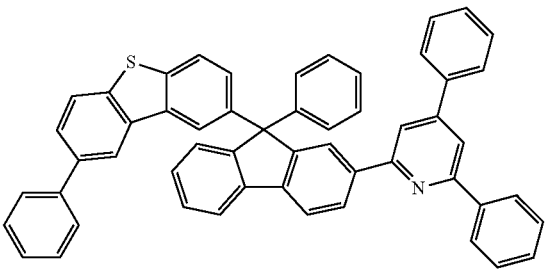

[Chemical Formula c-8]

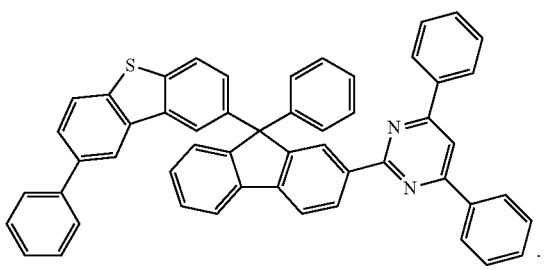

7. The compound for an organic optoelectronic device as claimed in claim 1, wherein the organic optoelectronic device is selected from an organic photoelectric device, an organic light emitting diode, an organic solar cell, an organic transistor, an organic photo-conductor drum, and an organic memory device.

8. An organic light emitting diode, comprising:
   an anode;
   a cathode; and
   at least one organic thin layer between the anode and the cathode,
   wherein the at least one organic thin layer includes the compound for an organic optoelectronic device as claimed in claim 1.

9. The organic light emitting diode as claimed in claim 8, wherein the at least one organic thin layer includes an emission layer, a hole transport layer (HTL), a hole injection layer (HIL), an electron transport layer (ETL), an electron injection layer (EIL), a hole blocking layer, or a combination thereof.

10. The organic light emitting diode as claimed in claim 9, wherein:
    the at least one organic thin layer includes the emission layer, and
    the compound is included in the emission layer.

11. The organic light emitting diode as claimed in claim 10, wherein the compound for an organic optoelectronic device is a phosphorescent green host material in the emission layer.

12. A display device comprising the organic light emitting diode as claimed in claim 8.

13. A compound for an organic optoelectronic device, wherein the compound is represented by the following Chemical Formula 5:

[Chemical Formula 5]

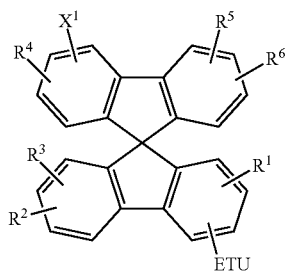

wherein, in the above Chemical Formula 5,

ETU is a substituent having electron characteristics, $R^1$ to $R^6$ are each independently hydrogen, a substituted or unsubstituted C1 to C6 alkyl group, a substituted or unsubstituted C6 to C30 aryl group, a substituted or unsubstituted C2 to C30 heteroaryl group, or a combination thereof, $X^1$ is a substituent having hole characteristics, and $X^1$ and $R^4$ are fused to an adjacent ring to provide a fused ring structure having hole characteristics.

14. The compound for an organic optoelectronic device as claimed in claim 13, wherein the ETU is a substituted or unsubstituted imidazolyl group, a substituted or unsubstituted triazolyl group, a substituted or unsubstituted tetrazolyl group, a substituted or unsubstituted oxadiazolyl group, a substituted or unsubstituted oxatriazolyl group, a substituted or unsubstituted thiatriazolyl group, a substituted or unsubstituted benzimidazolyl group, a substituted or unsubstituted benzotriazolyl group, a substituted or unsubstituted pyridinyl group, a substituted or unsubstituted pyrimidinyl group, a substituted or unsubstituted triazinyl group, a substituted or unsubstituted pyrazinyl group, a substituted or unsubstituted pyridazinyl group, a substituted or unsubstituted purinyl group, a substituted or unsubstituted quinolinyl group, a substituted or unsubstituted isoquinolinyl group, a substituted or unsubstituted phthalazinyl group, a substituted or unsubstituted naphpyridinyl group, a substituted or unsubstituted quinoxalinyl group, a substituted or unsubstituted quinazolinyl group, a substituted or unsubstituted acridinyl group, a substituted or unsubstituted phenanthrolinyl group, a substituted or unsubstituted phenazinyl group, a substituted or unsubstituted triperylenyl group, a substituted or unsubstituted triphenylenyl group, or a combination thereof.

15. The compound for an organic optoelectronic device as claimed in claim 13, wherein $X^1$ is NR'R", in which R' and R" are each independently a substituted or unsubstituted C6 to C30 aryl group or a substituted or unsubstituted C2 to C30 heteroaryl group.

16. The compound for an organic optoelectronic device as claimed in claim 15, wherein R' and R" are each independently a substituted or unsubstituted phenyl group, a substituted or unsubstituted naphthalenyl group, a substituted or unsubstituted fluorenyl group, a substituted or unsubstituted biphenyl group, a substituted or unsubstituted dibenzofuranyl group, a substituted or unsubstituted dibenzothiophenyl group, a substituted or unsubstituted anthracenyl group, a substituted or unsubstituted phenanthryl group, a substituted or unsubstituted naphthacenyl group, a substituted or unsubstituted pyrenyl group, a substituted or unsubstituted biphenylyl group, a substituted or unsubstituted p-terphenyl group, a substituted or unsubstituted m-terphenyl group, a substituted or unsubstituted chrysenyl group, a substituted or unsubstituted triperylenyl group, a substituted or unsubstituted perylenyl group, a substituted or unsubstituted indenyl group, a substituted or unsubstituted furanyl group, a substituted or unsubstituted thiophenyl group, a substituted or unsubstituted pyrrolyl group, a substituted or unsubstituted pyrazolyl group, a substituted or unsubstituted imidazolyl group, a substituted or unsubstituted triazolyl group, a substituted or unsubstituted oxazolyl group, a substituted or unsubstituted thiazolyl group, a substituted or unsubstituted oxadiazolyl group, a substituted or unsubstituted thiadiazolyl group, a substituted or unsubstituted pyridyl group, a substituted or unsubstituted pyrimidinyl group, a substituted or unsubstituted pyrazinyl group, a substituted or unsubstituted triazinyl group, a substituted or unsubstituted benzofuranyl group, a substituted or unsubstituted benzothiophenyl group, a substituted or unsubstituted benzimidazolyl group, a substituted or unsubstituted indolyl group, a substituted or unsubstituted quinolinyl group, a substituted or unsubstituted isoquinolinyl group, a substituted or unsubstituted quinazolinyl group, a substituted or unsubstituted quinoxalinyl group, a substituted or unsubstituted naphthyridinyl group, a substituted or unsubstituted benzoxazinyl group, a substituted or unsubstituted benzthiazinyl group, a substituted or unsubstituted acridinyl group, a substituted or unsubstituted phenazinyl group, a substituted or unsubstituted phenothiazinyl group, a substituted or unsubstituted phenoxazinyl group, or a combination thereof.

17. The compound for an organic optoelectronic device as claimed in claim 13, wherein the compound is represented by one of the following Chemical Formulae d-2 to d-6:

[Chemical Formula d-2]

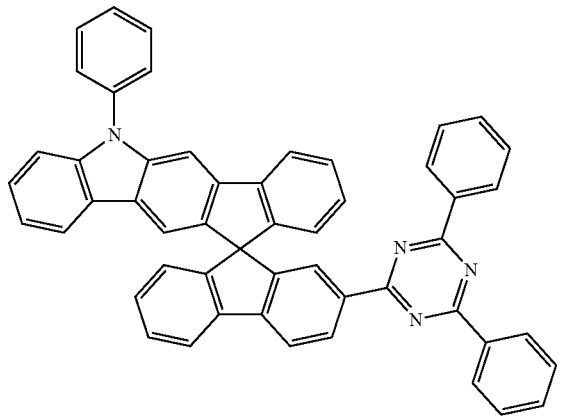

[Chemical Formula d-3]
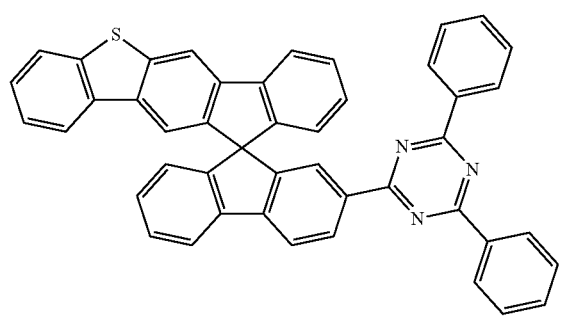
[Chemical Formula d-5]
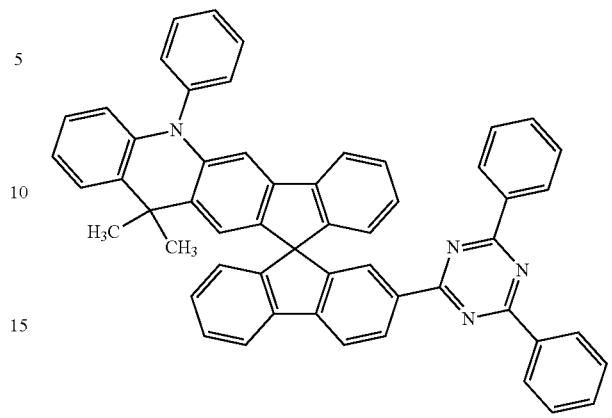
[Chemical Formula d-4]
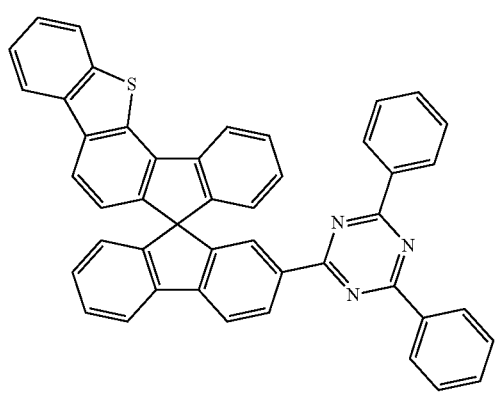
[Chemical Formula d-6]
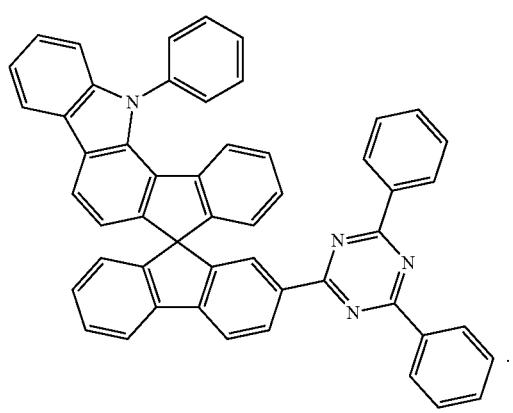
\* \* \* \* \*